(12) United States Patent
Takaki

(10) Patent No.: US 11,812,617 B2
(45) Date of Patent: Nov. 7, 2023

(54) SEMICONDUCTOR DEVICE HAVING A DAM STRUCTURE

(71) Applicant: SAMSUNG ELECTRONICS CO., LTD., Suwon-si (KR)

(72) Inventor: Sejie Takaki, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 313 days.

(21) Appl. No.: 17/214,879

(22) Filed: Mar. 28, 2021

(65) Prior Publication Data

US 2022/0139946 A1    May 5, 2022

(30) Foreign Application Priority Data

Oct. 30, 2020    (KR) .................. 10-2020-0143042

(51) Int. Cl.
*H10B 43/50* (2023.01)
*H01L 23/535* (2006.01)
(Continued)

(52) U.S. Cl.
CPC ........... *H10B 43/50* (2023.02); *H01L 23/535* (2013.01); *H01L 25/0657* (2013.01); *H10B 41/27* (2023.02); *H10B 41/41* (2023.02); *H10B 41/50* (2023.02); *H10B 43/27* (2023.02); *H10B 43/40* (2023.02); *H01L 2225/0651* (2013.01); *H01L 2225/06562* (2013.01); *H01L 2225/06586* (2013.01)

(58) Field of Classification Search
CPC ........ H10B 43/50; H10B 43/40; H10B 43/27; H10B 41/50; H10B 41/27; H10B 41/41; H01L 23/535; H01L 2225/0651; H01L 2225/06562; H01L 2225/06586
See application file for complete search history.

(56) References Cited

U.S. PATENT DOCUMENTS 9,837,433 B2    12/2017  Oh et al.
10,269,620 B2    4/2019  Yu et al.
(Continued)

OTHER PUBLICATIONS

European Search Report dated Mar. 3, 2022 in corresponding European Patent Application No. 21174151.7, 5 pages.
(Continued)

*Primary Examiner* — Lex H Malsawma
(74) *Attorney, Agent, or Firm* — F. CHAU & ASSOCIATES, LLC

(57) ABSTRACT

A semiconductor device includes a memory stack on a substrate, the memory stack including gate electrodes, insulating layers and mold layers, the mold layers being disposed at the same levels as the gate electrodes in a through electrode area, a channel structure extending vertically through the gate electrodes in a cell array area, and a dam structure disposed between the isolation insulating layers and surrounding the through electrode area in a top view. The dam structure includes a dam insulating layer having a dam shape, an inner insulating layer inside the dam insulating layer, and an outer insulating layer outside the dam insulating layer. The inner insulating layer includes first protrusions protruding in a horizontal direction, and the outer insulating layer includes second protrusions protruding in the horizontal direction.

20 Claims, 38 Drawing Sheets

(51) Int. Cl.
*H01L 25/065* (2023.01)
*H10B 41/27* (2023.01)
*H10B 41/41* (2023.01)
*H10B 41/50* (2023.01)
*H10B 43/27* (2023.01)
*H10B 43/40* (2023.01)

(56) References Cited

U.S. PATENT DOCUMENTS

| | | |
|---|---|---|
| 10,381,371 B2 | 8/2019 | Ogawa et al. |
| 10,573,659 B2 | 2/2020 | Oh et al. |
| 10,593,690 B2 | 3/2020 | Lu et al. |
| 11,404,427 B2 * | 8/2022 | Otsu ................. H10B 43/10 |
| 2013/0126957 A1 * | 5/2013 | Higashitani ........... H10B 43/40 |
| | | 257/E27.06 |
| 2017/0179026 A1 | 6/2017 | Toyama et al. |
| 2017/0179153 A1 * | 6/2017 | Ogawa ................. H10B 41/27 |
| 2019/0319038 A1 | 10/2019 | Zhang |
| 2020/0027893 A1 * | 1/2020 | Yang ................. H01L 21/76831 |
| 2020/0043830 A1 * | 2/2020 | Baek ................. H10B 41/27 |

OTHER PUBLICATIONS

Office Action dated Mar. 15, 2022 in corresponding European Patent Application No. 21174151.7, 6 pages.

\* cited by examiner

A-A'

SEMICONDUCTOR DEVICE HAVING A DAM STRUCTURE

CROSS-REFERENCE TO RELATED APPLICATION

This application claims priority under 35 U.S.C. § 119 to Korean Patent Application No. 10-2020-0143042, filed on Oct. 30, 2020, in the Korean Intellectual Property Office, the disclosure of which is incorporated by reference herein in its entirety.

TECHNICAL FIELD

The example embodiments of the disclosure relate to a semiconductor device having a dam structure.

DISCUSSION OF THE RELATED ART

In the electronics industry, integrated circuit devices with memory devices are increasing in capacity and becoming highly integrated. Also, memory cells are becoming smaller in size, and operation circuits and wiring structures included in memory devices are becoming increasingly complicated. Therefore, integrated circuit devices having memory devices with highly integrated structure and good electrical characteristics are needed.

A 3-dimensional nonvolatile memory device having a multi-stack structure has been proposed for lightness, thinness, simplification, miniaturization, and high integration of electronic products. Such a nonvolatile memory device includes gate electrodes and a through electrode.

SUMMARY

Example embodiments of the present disclosure provide a semiconductor device having a dam structure including protrusions.

A semiconductor device according to example embodiments of the present disclosure may include a substrate including a cell array area and an extension area, the extension area including a through electrode area, and a memory stack on the substrate and including gate electrodes, insulating layers and mold layers, the gate electrodes and the insulating layers being sequentially stacked, the mold layers including an insulating material and disposed at the same levels as the gate electrodes in the through electrode area. The semiconductor device may further include a channel structure extending vertically through the gate electrodes in the cell array area, isolation insulating layers extending vertically through the memory stack and extending in a first horizontal direction, the isolation insulating layers being spaced apart from one another in a second horizontal direction intersecting with the first horizontal direction, and a dam structure disposed between the isolation insulating layers and surrounding the through electrode area in a top view. The dam structure may include a dam insulating layer having a dam shape, an inner insulating layer inside the dam insulating layer, and an outer insulating layer outside the dam insulating layer. The inner insulating layer may include first protrusions protruding in a horizontal direction, and the outer insulating layer may include second protrusions protruding in the horizontal direction.

A semiconductor device according to example embodiments of the disclosure may include a substrate including a cell array area and an extension area, the extension area including a through electrode area, a lower memory stack on the substrate, the lower memory stack including lower gate electrodes, lower insulating layers and lower mold layers, the lower gate electrodes and the lower insulating layers being sequentially stacked, the lower mold layers including an insulating material and being disposed at the same levels as the lower gate electrodes in the through electrode area, respectively, and an upper memory stack on the lower memory stack, the upper memory stack including upper gate electrodes, upper insulating layers and upper mold layers, the upper gate electrodes and the upper insulating layers being sequentially stacked, the upper mold layers including an insulating material and being disposed at the same levels as the upper gate electrodes in the through electrode area, respectively. The semiconductor device may further include a channel structure extending vertically through the gate electrodes in the cell array area, isolation insulating layers extending vertically through the lower memory stack and the upper memory stack and extending in a first horizontal direction, the isolation insulating layers being spaced apart from one another in a second horizontal direction intersecting with the first horizontal direction, and a dam structure disposed between the isolation insulating layers and surrounding the through electrode area in a top view. The dam structure may include a dam insulating layer having a dam shape, an inner insulating layer inside the dam insulating layer, and an outer insulating layer outside the dam insulating layer. The inner insulating layer may include first protrusions protruding in a horizontal direction, and the outer insulating layer may include second protrusions protruding in the horizontal direction.

A data storage system according to example embodiments of the disclosure may include a semiconductor storage device including a substrate including a cell array area and an extension area, the extension area including a through electrode area, a memory stack on the substrate including gate electrodes, insulating layers and mold layers, the gate electrodes and the insulating layers being sequentially stacked, the mold layers including an insulating material and being disposed at the same levels as the gate electrodes in the through electrode area, respectively, and a channel structure extending vertically through the gate electrodes in the cell array area, isolation insulating layers extending vertically through the memory stack and extending in a first horizontal direction, the isolation insulating layers being spaced apart from one another in a second horizontal direction intersecting with the first horizontal direction. The data storage system may further include a peripheral circuit structure disposed between the substrate and the memory stack, the peripheral circuit structure including peripheral circuit devices, an input/output pad electrically connected to the peripheral circuit devices, a through electrode disposed in the through electrode area, the through electrode extending vertically through the mold layers such that the through electrode is electrically connected to the peripheral circuit structure, a dam structure disposed between the isolation insulating layers and surrounding the through electrode area in a top view, and a controller electrically connected to the semiconductor storage device through the input/output pad, and configured to control the semiconductor storage device. The dam structure may include a dam insulating layer having a dam shape, an inner insulating layer inside the dam insulating layer, and an outer insulating layer outside the dam insulating layer. The inner insulating layer may include first protrusions protruding in a horizontal direction, and the outer insulating layer may include second protrusions protruding in the horizontal direction.

BRIEF DESCRIPTION OF THE DRAWINGS

The above and other objects, features, and advantages of the inventive concept will become more apparent to those skilled in the art upon consideration of the following detailed description with reference to the accompanying drawings.

DETAILED DESCRIPTION OF THE EMBODIMENTS

Figure 1:
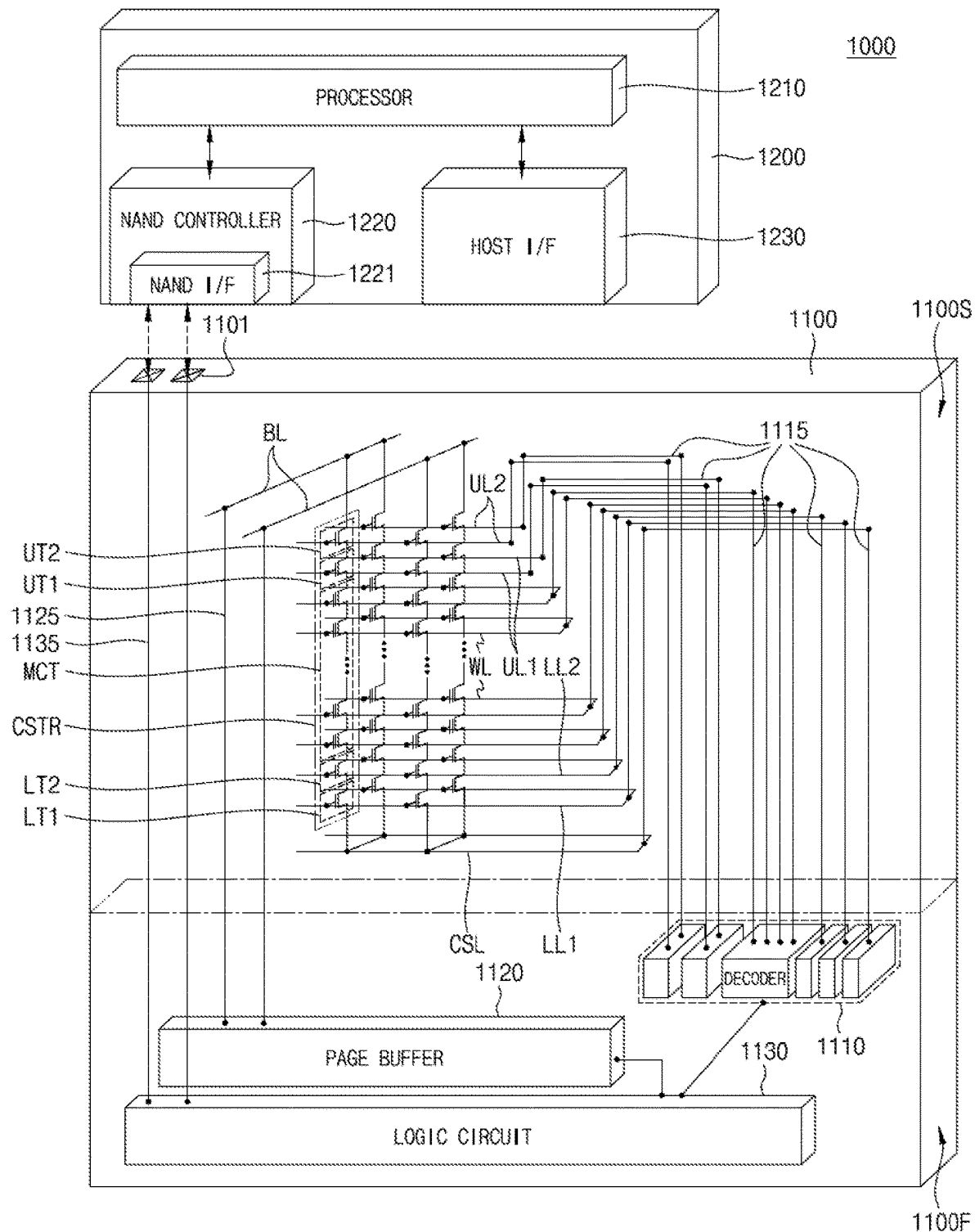
FIG. 1 is a block diagram of a memory system according to an example embodiment of the inventive concepts.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification.

FIG. 1 is a block diagram of a memory system according to an example embodiment of the disclosure.

Referring to FIG. 1, a memory system 1000 may include a memory device 1100, and a controller 1200 connected to an input/output pad 1101 of the memory device 1100. The memory device 1100 may include a cell area 1100S and a peripheral circuit area 1100F.

The cell area 1100S may include a plurality of cell strings CSTR each including memory cell transistors MCT connected to one another in series, and a first upper transistor UT1, a second upper transistor UT2, a first lower transistor LT1 and a second lower transistor LT2, which are connected to opposite ends of the memory cell transistors MCT. The plurality of cell strings CSTR may be respectively connected to corresponding bit lines of the bit lines BL in parallel. The plurality of cell strings CSTR may be connected to a common source line CSL. For example, a plurality of cell strings CSTR may be disposed between a plurality of bit lines BL and a single common source line CSL.

The memory cell transistors MCT, which are connected to one another in series, may be controlled by word lines WL for selecting cell strings CSTR. Each of the memory cell transistors MCT may include a data storage element. Gate electrodes of the memory cell transistors MCT spaced apart from the common source line CSL by the same distance may be connected to one of the word lines WL in common and may be in an equipotential state. Otherwise, even when the gate electrodes of the memory cell transistors MCT are spaced apart from the common source line CSL by the same distance, the gate electrodes, which are disposed in different rows or columns, may be independently controlled.

The first lower transistor LT1 and the second lower transistor LT2 may be ground selection transistors, respectively. The first lower transistor LT1 and the second lower transistor LT2 may be controlled by a first lower line LL1 and a second lower line LL2, respectively, and may be connected to the common source line CSL. The first upper transistor UT1 and the second upper transistor UT2 may be string selection transistors. The first upper transistor UT1 and the second upper transistor UT2 may be controlled by a first upper line UL1 and a second upper line UL2, respectively, and may be connected to corresponding bit lines of the bit lines BL. In an example embodiment, at least one dummy line or buffer line may be further disposed between an uppermost one of word lines WL and the first upper transistor UT1. At least one dummy line may also be disposed between a lowermost word line of the word lines WL and the second lower transistor LT2. In the specification, the term "dummy" is used to represent a configuration which has a structure and a shape identical or similar to those of another constituent element, but is simply present as a pattern without performing a substantial function in a device.

When a signal is applied to the first upper transistor UT1 and the second upper transistor UT2, which are string selection transistors, via the first upper line UL1 and the second upper line UL2, a signal applied to the corresponding bit line BL is transferred to the memory cell transistors MCT connected to one another in series and a data read or data write operation may be executed. In addition, when a predetermined erase voltage is applied through a substrate, a data erase operation for erasing data written in the memory cell transistors MCT may be executed. In an example embodiment, the cell area 1100S may include at least one dummy cell string CSTR electrically isolated from the bit lines BL.

The peripheral circuit area 1100F may include a row decoder 1110, a page buffer 1120, and a logic circuit 1130. The row decoder 1110 may be connected to the word lines WL, the first upper transistor UT1, the second upper transistor UT2, the first lower transistor LT1, the second lower transistor LT2, and the common source line CSL. The page buffer 1120 may be connected to the bit lines BL via connection lines 1125. The logic circuit 1130 may be connected to the row decoder 1110 and the page buffer 1120, and may be connected to a controller 1200 via the input/output pad 1101.

The row decoder 1110 decodes an input address, thereby generating and transferring drive signals for the word lines WL. The row decoder 1110 may provide a word line voltage generated from a voltage generation circuit in the logic circuit 1130 under control of the logic circuit 1130 to a selected word line of the word lines WL and an unselected word line of the word lines WL.

The page buffer 1120 may be connected to the cell area 1100S via a bit line BL and may read out information stored in a memory cell. The page buffer 1120 may temporarily store data to be stored in the memory cell or may sense data stored in the memory cell in accordance with an operation mode. The page buffer 1120 may include a column decoder and a sense amplifier. The column decoder may selectively activate the bit lines BL of the cell area 1100S. The sense amplifier may sense a voltage of the bit line BL selected by the column decoder in a read operation and may read out data stored in a selected memory cell.

The logic circuit 1130 may control operation of the row decoder 1110 and operation of the page buffer 1120. The logic circuit 1130 may include a voltage generation circuit configured to generate voltages required for internal operations, for example, a program voltage, a read voltage, an erase voltage, etc., using an external voltage. The logic circuit 1130 may control a read operation, a write operation and/or an erase operation in response to control signals. In addition, the logic circuit 1130 may include an input/output circuit. In a program operation, the input/output circuit may receive data DATA input thereto, and may transfer the received data DATA to the page buffer 1120. In a read operation, the input/output circuit may receive data DATA from the page buffer 1120, and may output the received data DATA to the outside thereof, for example, to the logic circuit 1130. The logic circuit 1130 may be connected to the controller 1200 via a connection line 1135 and the input/output pad 1101.

The controller 1200 may include a processor 1210, a NAND controller 1220, and a host interface 1230. The processor 1210 performs control operations for data exchange of the NAND controller 1220. The NAND controller 1220 controls data exchange with the memory device 1100. The NAND controller 1220 may include a NAND interface 1221. The NAND interface 1221 interfaces with the memory device 1100 according to the example embodiment of the disclosure. The host interface 1230 includes a data exchange protocol of a host connected to the memory system 1000.

Figure 2:
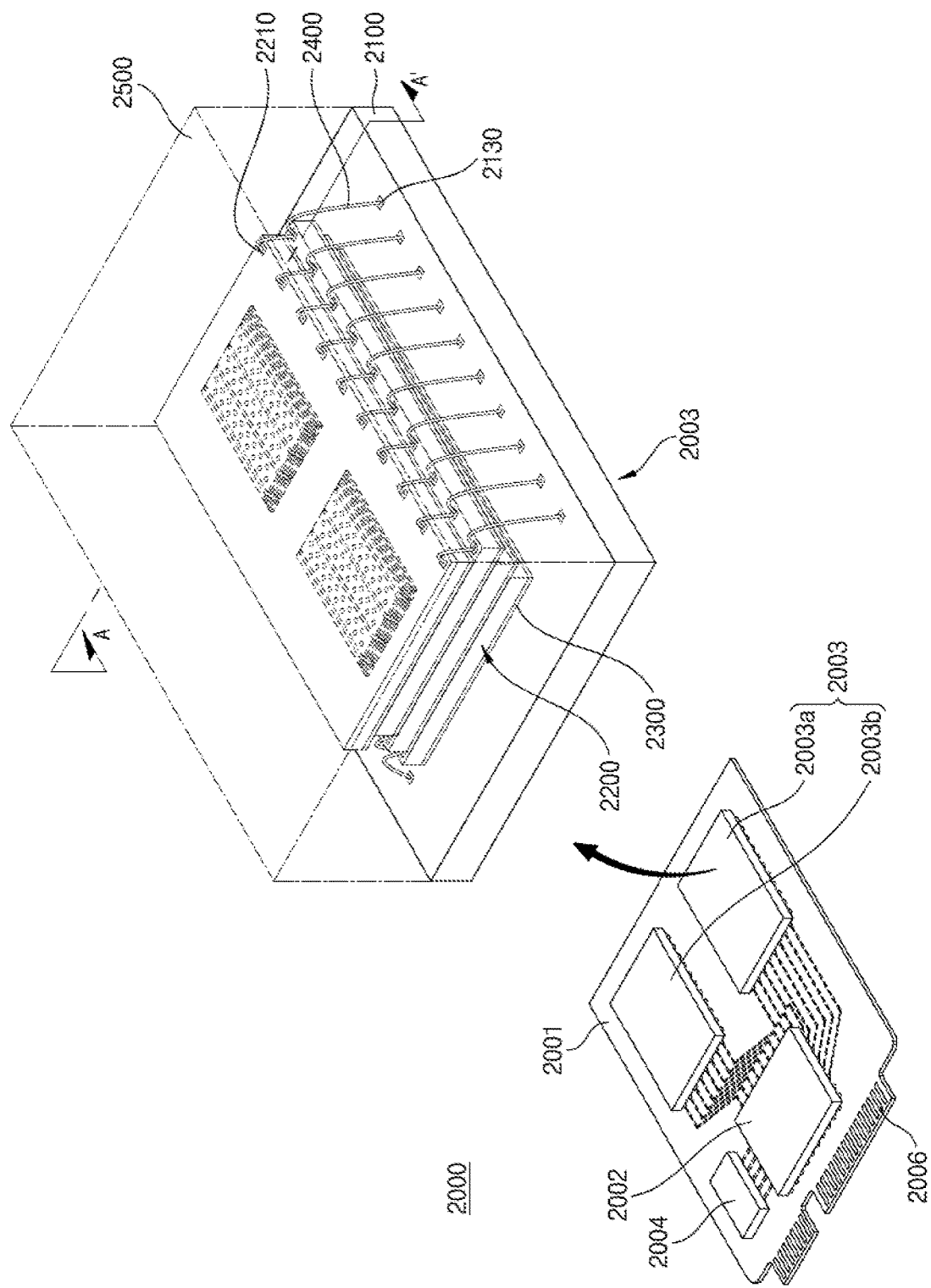
FIG. 2 is a schematic view of a memory system according to an example embodiment of the inventive concepts.
Figure 3:
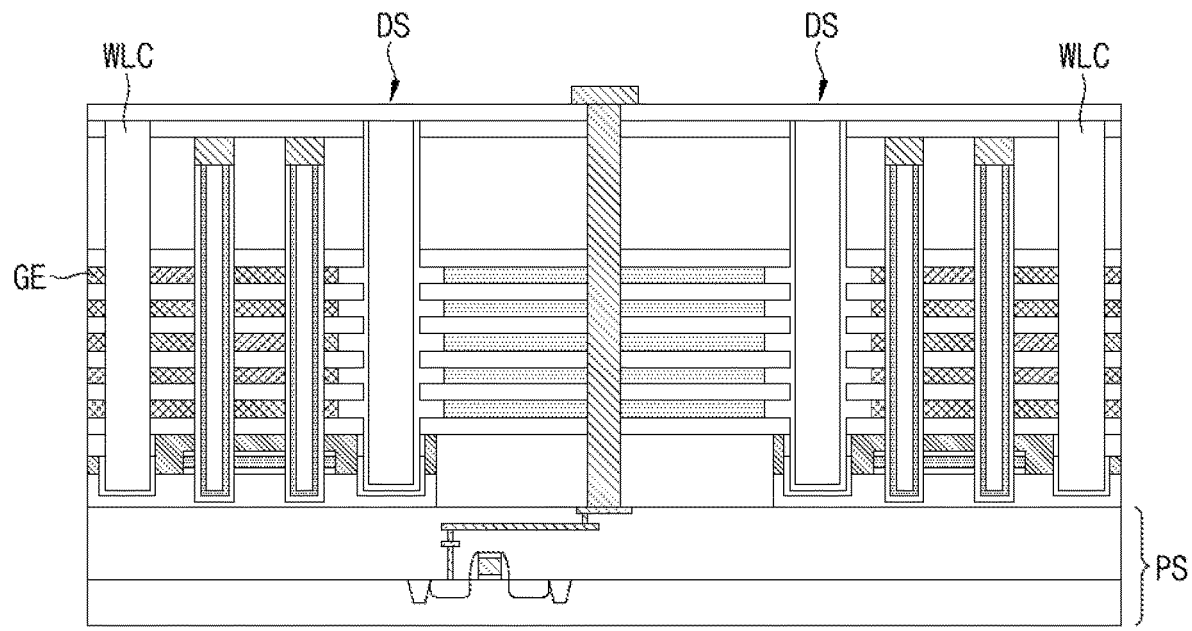
FIG. 3 is a vertical cross-sectional view taken along line A-A' of a semiconductor package shown in FIG. 2.
Figure 3:
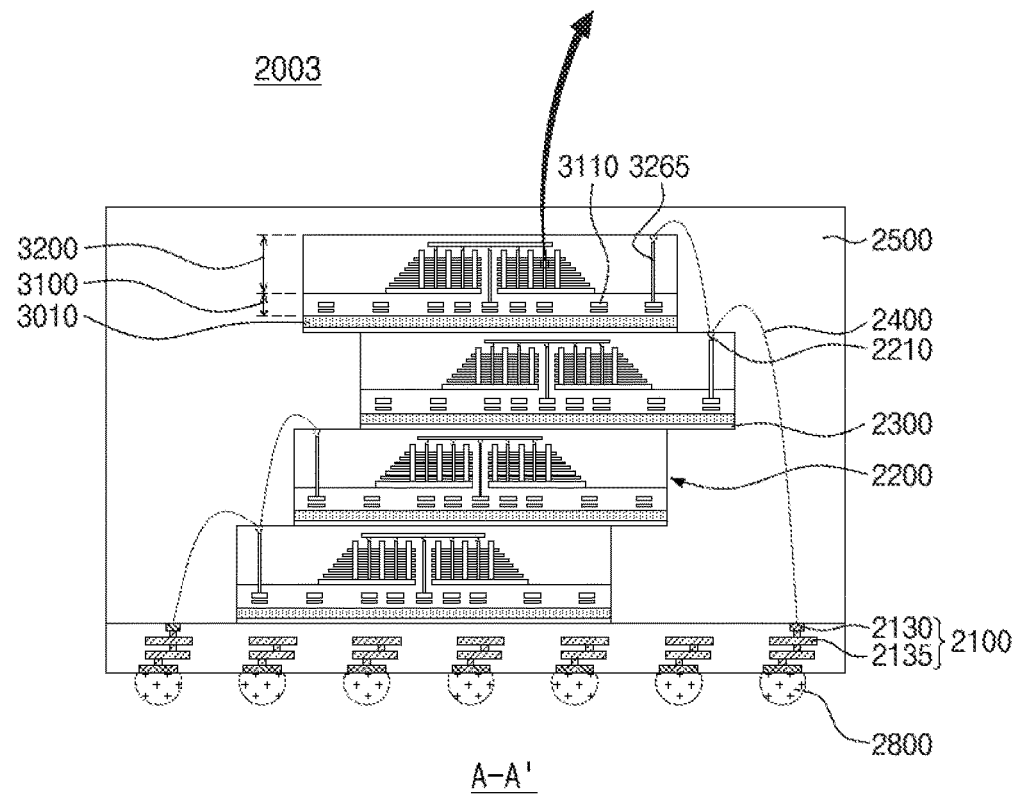

FIG. 2 is a schematic view of a memory system according to an example embodiment of the inventive concepts. FIG. 3 is a vertical cross-sectional view taken along line A-A' of a semiconductor package shown in FIG. 2.

Referring to FIG. 2, the memory system 2000 may be or be a part of a solid state drive (SSD), a memory card, or a universal serial bus (USB). The memory system 2000 may include semiconductor packages 2003 (2003a and 2003b), devices 2002 and 2004, and a connector 2006 which are disposed on a main substrate 2001. In an example embodiment, each of the semiconductor packages 2003 (2003a and 2003b) may include the memory device 1100 shown in FIG. 1. The devices 2002 and 2004 may correspond to the controller 1200. For example, each semiconductor package 2003 may include a package substrate 2100, memory devices 2200 stacked on the package substrate 2100 while including chip pads 2210, an adhesive layer 2300 between the package substrate 2100 and each of the memory devices 2200, wires 2400 electrically connecting the package substrate 2100 and respective memory devices 2200, and an encapsulator 2500 covering the package substrate 2100 and the memory devices 2200.

Referring to FIG. 3, the package substrate 2100 may include a substrate pad 2130 and a wiring layer 2135. The substrate pad 2100 may be disposed on an upper surface of the package substrate 2100, and may be connected to a wire 2400. The wiring layer 2135 may be disposed in the package substrate 2100, and may be electrically connected to the substrate pad 2130.

A plurality of memory devices 2200 may be stacked on the package substrate 2100. Each memory device 2200 may include a peripheral circuit area 3100 on a substrate 3010, and a cell area 3200 on the peripheral circuit area 3100. The cell area 3200 and the peripheral circuit area 3100 may correspond to the cell area 1100S and the peripheral circuit area 1100F in FIG. 1, respectively.

The peripheral circuit area 3100 may include peripheral circuit devices 3110 therein. The cell area 3200 may include a through electrode 3265. The through electrode 3265 may be connected to the peripheral circuit devices 3110, and may be connected to a chip pad 2210 electrically connected to the wire 2400.

Each memory device 2200 may correspond to a semiconductor device 100 which will be described later with reference to FIG. 4. The plurality of memory devices 2200 may be fixed to one another by adhesive layers 2300 respectively disposed on lower surfaces of the memory devices 2200, and may be connected to the package substrate 2100 by the wire 2400. An external connection terminal 2800 may be disposed on a lower surface of the package substrate 2100.

Figure 4:
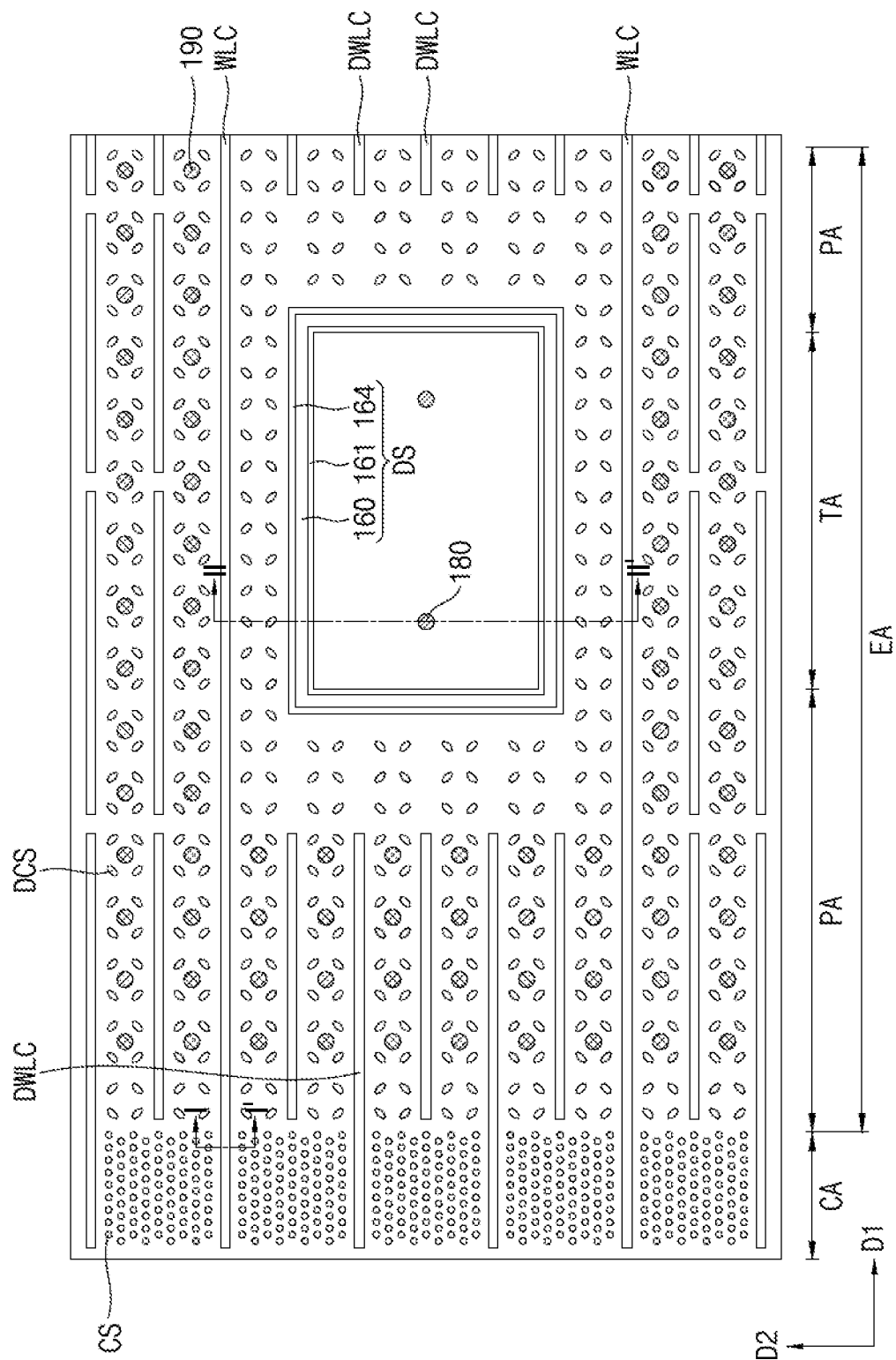
FIG. 4 is a layout of a semiconductor device according to an example embodiment of the inventive concepts.
Figure 5:
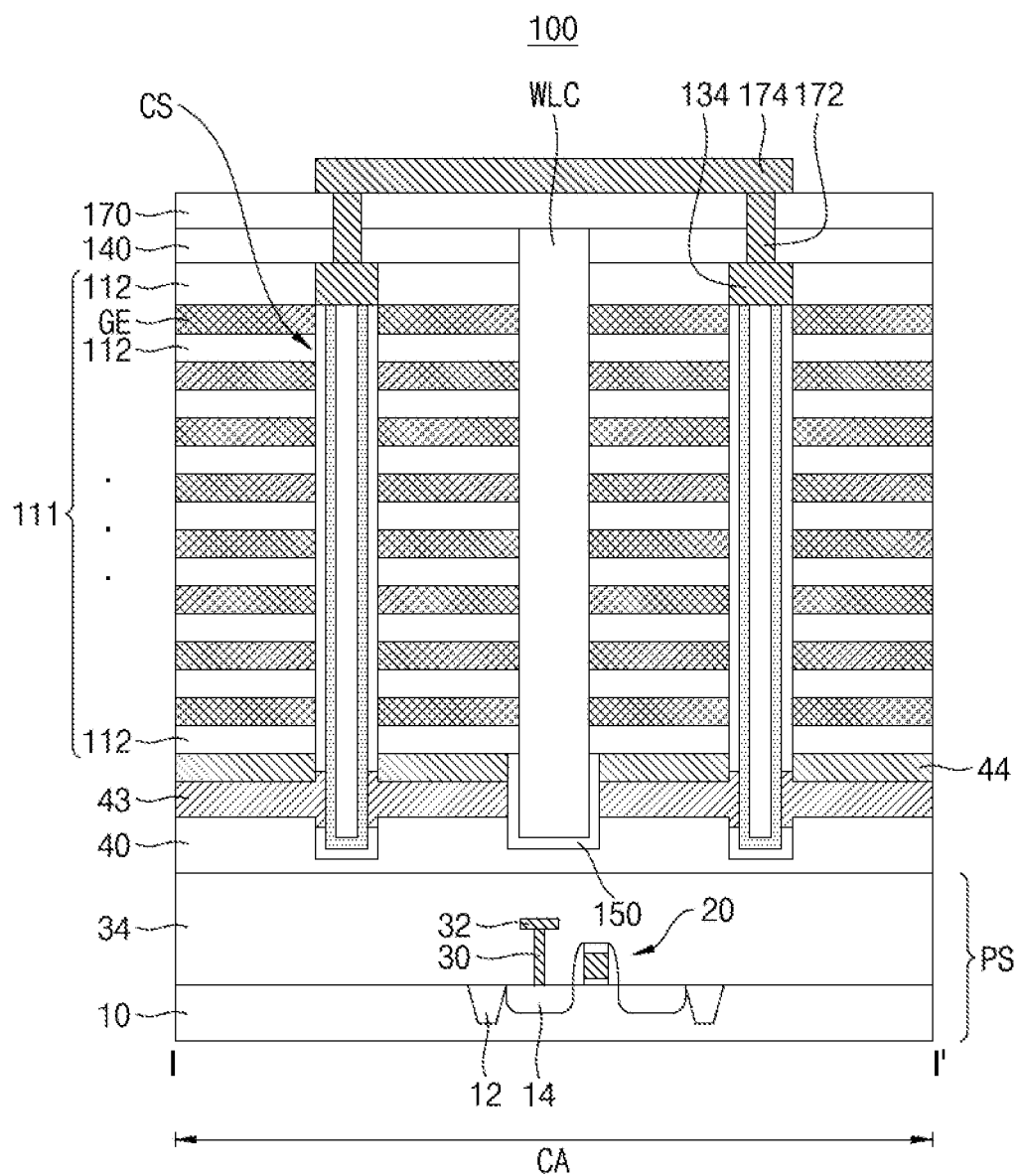
FIG. 5 is a vertical cross-sectional view taken along line I-I' of the semiconductor device shown in FIG. 4.
Figure 6:
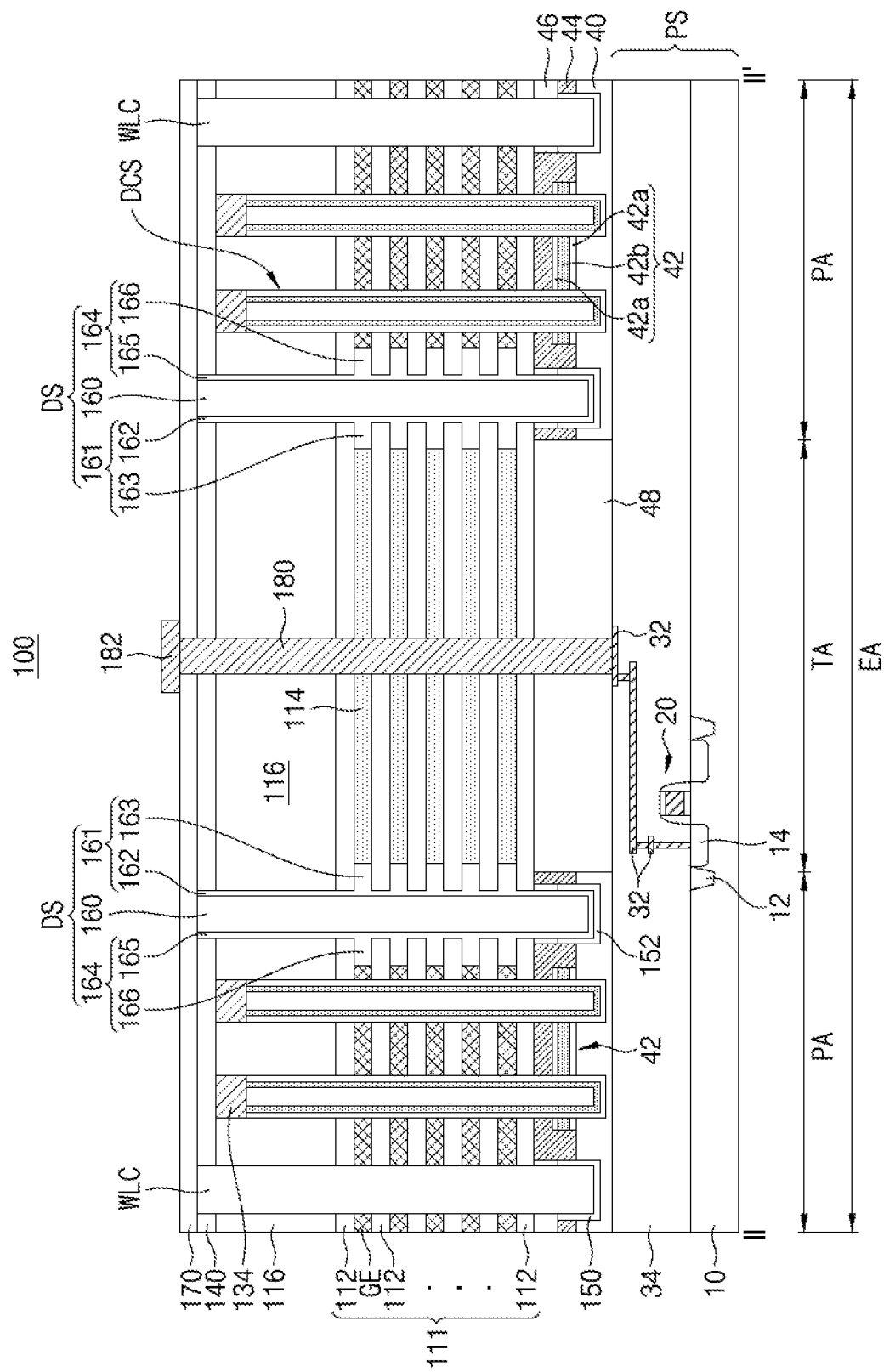
FIG. 6 is a vertical cross-sectional view taken along line II-II' of the semiconductor device shown in FIG. 4.

FIG. 4 is a layout of a semiconductor device according to an example embodiment of the inventive concepts. FIG. 5 is a vertical cross-sectional view taken along line I-I' of the semiconductor device shown in FIG. 4. FIG. 6 is a vertical cross-sectional view taken along line II-II' of the semiconductor device shown in FIG. 4. Semiconductor devices according to the example embodiments of the inventive concepts may include flash memory such as 3D-NAND.

Referring to FIG. 4, a semiconductor device 100 may include a cell array area CA and an extension area EA.

The cell array area CA may include channel structures CS. The extension area EA may include pad areas PA, and a through electrode area TA between the pad areas PA. The through electrode area TA may include through electrodes 180. The extension area EA may include dummy channel structures DCS and gate contacts 190. Each gate contact 190 may be disposed between corresponding ones of the dummy channel structures DCS, and may include tungsten.

The semiconductor device 100 may include a dam structure DS, isolation insulating layers WLC, and dummy insulating layers DWLC. The through electrode area TA may be defined by an area surrounded by the dam structure DS. The isolation insulating layers WLC may extend through the cell array area CA and the extension area EA in a first horizontal direction D1. The isolation insulating layers WLC may be spaced apart from each other in a second horizontal direction D2. The dam structure DS may be disposed between isolation insulating layers WLC. The dummy isolation insulating layers DWLC may be disposed between the isolation insulating layers WLC, and may extend in the first horizontal direction D1.

Referring to FIGS. 5 and 6, the semiconductor device 100 may include a peripheral circuit structure PS, a memory stack 111, channel structures CS, dummy channel structures DCS, a dam structure DS, and a through electrode 180. The semiconductor device 100 according to the example embodiment of the disclosure may have a cell-over-peri (COP) structure. For example, the peripheral circuit structure PS may be disposed under the memory stack 111. The peripheral circuit structure PS may be formed on a substrate 10, and may include a device isolation layer 12, an impurity region 14, a transistor 20, a contact plug 30, a peripheral circuit wiring 32, and a peripheral insulating layer 34. In an example embodiment, the peripheral circuit structure PS may include a peripheral circuit device 3110 shown in FIG.

3. The peripheral circuit device 3110 may include an active device such as a transistor and/or a passive device such as a resistor, an inductor, etc.

The device isolation layer 12 and the impurity region 14 may be disposed on an upper surface of the substrate 10. The transistor 20, the contact plug 30 and the peripheral circuit wiring 32 may be disposed on the substrate 10. The substrate 10 may include a semiconductor material. For example, the substrate 10 may be a silicon substrate, a germanium substrate, a silicon germanium substrate or a silicon-on-insulator (SOI) substrate. In an example embodiment, the substrate 10 may include a group IV semiconductor, a group III-V compound semiconductor, or a group II-VI oxide semiconductor. However, the substrate types and constituent materials are not necessarily limited thereto.

The impurity region 14 may be disposed adjacent to the transistor 20. The peripheral insulating layer 34 may cover the transistor 20 and the contact plug 30. The contact plug 30 may be electrically connected to the impurity region 14. The peripheral circuit wiring 32 may be connected to the contact plug 30.

The semiconductor device 100 may include a lower conductive layer 40, a connecting mold layer 42, a connecting conductive layer 43, a supporter 44, an isolation layer 46 and a buried insulating layer 48, which are disposed between the peripheral circuit structure PS and the memory stack 111. The lower conductive layer 40 may be disposed on the peripheral insulating layer 34. The lower conductive layer 40 may correspond to the common source line CSL of FIG. 1. In an example embodiment, the lower conductive layer 40 may include doped polysilicon. The connecting mold layer 42 and the connecting conductive layer 43 may be disposed on the lower conductive layer 40. The connecting mold layer 42 may contact the dummy channel structures DCS in the extension area EA. The connecting conductive layer 43 may contact the channel structures CS in the cell array area CA. The supporter may cover the connecting conductive layer 43 in the cell array area CA, and may cover the connecting mold layer 42 in the extension area EA while contacting an upper surface of the lower conductive layer 40. The supporter 44 may have a recessed portion. The isolation layer 46 may fill the recessed portion. The isolation layer 46 may contact an isolation insulating layer WLC. The buried insulating layer 48 may be disposed in the extension area EA. For example, the buried insulating layer 48 may be disposed in a through electrode area TA, and may extend through the lower conductive layer 40 and the supporter 44 such that the buried insulating layer 48 contacts the peripheral circuit structure PS.

The memory stack 111 may be disposed on the supporter 44. The memory stack 111 may include insulating layers 112, mold layers 114, and gate electrodes GE. The gate electrodes GE may be stacked alternately with the insulating layers 112. The mold layers 114 may be disposed in the through electrode area TA, and may be stacked alternately with the insulating layers 112. Each mold layer 114 may be disposed at the same level as a corresponding gate electrode of the gate electrodes GE. The gate electrodes GE may correspond to the word lines WL, the first upper line UL1, the second upper line UL2, the first lower line LL1 and the second lower line LL2, respectively.

At least one of the gate electrodes GE disposed on a lower portion of the memory stack 111 may be a ground selection line (GSL). At least one of the gate electrodes GE disposed on an upper portion of the memory stack 111 may be a string selection line (SSL) or a drain selection line (DSL). In an example embodiment, the insulating layers 112 may include silicon oxide. The mold layers 114 may include silicon nitride. The gate electrodes GE may include tungsten, but the above materials are not necessarily limited thereto.

The semiconductor device 100 may include an interlayer insulating layer 116. The memory stack 111 may have a stepped structure such that its height gradually reduces while extending from the cell array area CA toward the extension area EA. The interlayer insulating layer 116 may cover the stepped structure of the memory stack 111.

The channel structures CS may extend through the connecting conductive layer 43, the supporter 44 and the memory stack 111 in a vertical direction in the cell array area CA. The channel structures CS may be electrically connected to the connecting conductive layer 43. Conductive pads 134 may be disposed on the channel structures CS. The channel structures CS may correspond to the cell strings CSTR of FIG. 1. In an example embodiment, each channel structure CS may have a tapered shape such that the horizontal width of the channel structure CS is gradually reduced as the channel structure CS extends downwards.

The dummy channel structures DCS may be disposed in the extension area EA, and may extend through the connecting mold layer 42, the memory stack 111, and the interlayer insulating layer 116. The dummy channel structures DCS may include a configuration identical or similar to that of the channel structures CS.

The semiconductor device 100 may include a first upper insulating layer 140 on the interlayer insulating layer 116. The first upper insulating layer 140 may cover upper surfaces of the interlayer insulating layer 116 and the conductive pad 134. The first upper insulating layer 140 may include silicon oxide.

The isolation insulating layers WLC may be disposed in the cell array area CA and the extension area EA, and may extend through the memory stack 111 and the first upper insulating layer 140. In addition, the isolation insulating layers WLC in the cell array area CA may extend through the connecting conductive layer 43 and the supporter 44. The isolation insulating layers WLC in the extension area EA may extend through the supporter 44 and the buried insulating layer 48. In an example embodiment, each isolation insulating layer WLC may have a tapered shape such that the horizontal width of the isolation insulating layer WLC is gradually reduced as the isolation insulating layer WLC extends downwards. The isolation insulating layers WLC may include silicon oxide, silicon nitride, silicon oxynitride, or a combination thereof. In an example embodiment, the isolation insulating layers WLC may include silicon oxide.

The semiconductor device 100 may include a first lower oxide layer 150 and a second lower oxide layer 152. The first lower oxide layer 150 may surround a lower portion of each isolation insulating layer WLC. For example, the first lower oxide layer 150 may cover a portion of a side surface of the isolation insulating layer WLC and a lower surface of the isolation insulating layer WLC, while contacting the lower conductive layer 40 and the supporter 44. The second lower oxide layer 152 may surround a lower portion of the dam structure DS. For example, the second lower oxide layer 152 may surround a portion of a side surface of the dam structure DS and a lower surface of the dam structure DS while contacting the lower conductive layer 40 and the supporter 44.

When viewed in a top view, the dam structure DS may surround the through electrode area TA. When viewed in a longitudinal cross-sectional view, the dam structure DS may be disposed between each pad area PA and the through electrode area TA, and may extend vertically through the memory stack 111 and the first upper insulating layer 140. An upper surface of the dam structure DS may be coplanar with an upper surface of the first upper insulating layer 140 and an upper surface of each isolation insulating layer WLC. The dam structure DS may be disposed between the gate electrodes GE and the mold layers 114. The mold layers 114 may be spatially and electrically isolated from the gate electrodes GE by the dam structure DS. In an example embodiment, the dam structure DS may have a tapered shape such that the horizontal width of the dam structure DS is gradually reduced as the dam structure DS extends downwards.

The dam structure DS may include a dam insulating layer 160, an inner insulating layer 161, and an outer insulating layer 164. The dam insulating layer 160 may have a dam shape, and may extend through the memory stack 111, the interlayer insulating layer 116 and the first upper insulating layer 140. In an example embodiment the dam insulating layer 160 may include silicon oxide.

The inner insulating layer 161 may be disposed inside the dam insulating layer 160. For example, the inner insulating layer 161 may be disposed on an inner perimeter of the dam insulating layer 160. For example, when viewed in a top view, the inner insulating layer 161 may surround the through electrode area TA, and may be disposed between the through electrode area TA and the dam insulating layer 160. The inner insulating layer 161 may include a first side insulating layer 162 and first protrusions 163. The first side insulating layer 162 may contact an inner surface of the dam insulating layer 160 while extending in a vertical direction. The first protrusions 163 may extend form the first side insulating layer 162 in a horizontal direction, and may be disposed between adjacent insulating layers 112. The first protrusions 163 may be vertically spaced apart from one another, and may be disposed at the same levels as corresponding gate electrodes GE and mold layers 114. Each first protrusion 163 may contact a corresponding mold layer 114 in the through electrode area TA. When viewed in a longitudinal cross-sectional view, the horizontal cross-section of each mold layer 114 may contact a corresponding one of the first protrusions 163. A horizontal length of each mold layer 114 may be smaller than a horizontal length of a corresponding insulating layer 112 adjacent to the mold layer 114. The first side insulating layer 162 may be materially contiguous with the first protrusions 163. In an example embodiment, the first side insulating layer 162 and the first protrusions 163 may include silicon oxide.

The outer insulating layer 164 may be disposed outside the dam insulating layer 160. For example, the outer insulating layer 164 may be disposed on an outer perimeter of the dam insulating layer 160. For example, when viewed in a top view, the outer insulating layer 164 may surround the dam insulating layer 160. The outer insulating layer 164 may include a second side insulating layer 165 and second protrusions 166. The second side insulating layer 165 may contact an outer surface of the dam insulating layer 160 while extending in a vertical direction. The second protrusions 166 may protrude from the second side insulating layer 165 in a horizontal direction, and may be disposed between adjacent insulating layers 112. The second protrusions 166 may be spaced apart from one another in a vertical direction, and may be disposed at the same levels as corresponding gate electrodes GE, mold layers 114 and first protrusions 163. Each second protrusion 166 may contact a corresponding gate electrode GE. The second side insulating layer 165 may be materially contiguous with the second protrusions 166. In an example embodiment, the second side insulating layer 165 and the second protrusions 166 may include silicon oxide.

The second side insulating layer 165 may be materially contiguous with the first side insulating layer 162. The first side insulating layer 162 and the second side insulating layer 165 may meet at a lower surface of the dam insulating layer 160. For example, the first side insulating layer 162 may extend from the inner surface of the dam insulating layer 160 along the lower surface of the dam insulating layer 160, whereas the second side insulating layer 165 may extend from the outer surface of the dam insulating layer 160 along the lower surface of the dam insulating layer 160. In an example embodiment, the first side insulating layer 162, the first protrusions 163, the second side insulating layer 165, and the second protrusions 166 may be integrally formed. The first protrusions 163 and the second protrusions 166 may extend in a horizontal direction. For example, the first protrusions 163 may extend in the horizontal direction and surround the through electrode area TA, whereas the second protrusions 166 may extend in the horizontal direction and surround the dam insulating layer 160.

Although the first protrusions 163 and the second protrusions 166 are illustrated as having the same horizontal width in FIG. 6, the first protrusions 163 and the second protrusions 166 are not necessarily limited thereto. In an example embodiment, the first protrusions 163 may have different horizontal widths, and the second protrusions 166 may have different horizontal widths. In an example embodiment, the horizontal width of at least one of the first protrusions 163 may differ from the horizontal width of at least one of the second protrusions 166. In an example embodiment, the horizontal widths of the first protrusions 163 and the second protrusions 166 may be 0 to 100 nm.

The semiconductor device 100 may include a second upper insulating layer 170, bit line plugs 172, and a bit line 174. The second upper insulating layer 170 may be disposed in the cell array area CA and the extension area EA, and may cover the first upper insulating layer 140. The bit line plugs 172 extend through the first upper insulating layer 140 and the second upper insulating layer 170 and may contact corresponding conductive pads 134. The bit line 174 may be disposed on the second upper insulating layer 170, and may contact the bit line plugs 172. The bit line 174 may be electrically connected to corresponding channel structures CS. The bit line 174 may correspond to one bit line BL of FIG. 1.

The semiconductor device 100 may include a through electrode 180 and a connecting wiring 182 in the through electrode area TA. The through electrode 180 may extend through the buried insulating layer 48, the memory stack 111, the interlayer insulating layer 116, the first upper insulating layer 140 and the second upper insulating layer 170, and may be connected to the peripheral circuit wiring 32. The connecting wiring 182 may contact the through electrode 180 on the second upper insulating layer 170. The through electrode 180 may electrically connect the connecting wiring 182 to the peripheral circuit structure PS.

Figure 7:
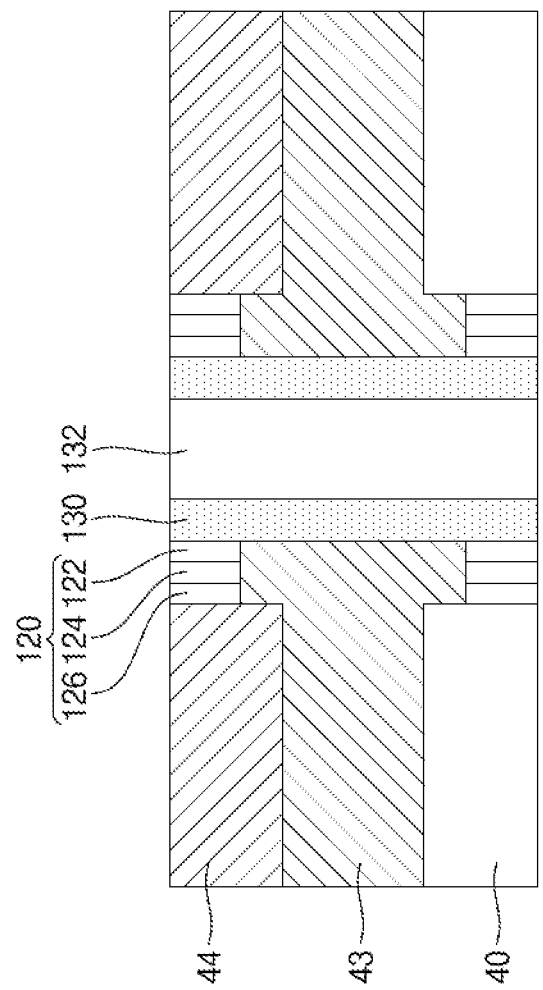
FIG. 7 illustrates enlarged views of the semiconductor device shown in FIG. 5.
Figure 7:
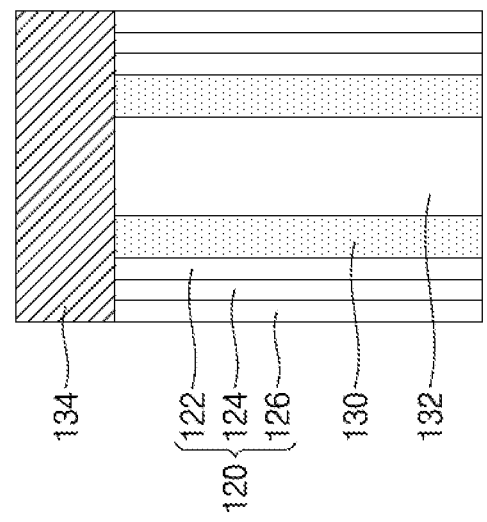

FIG. 7 is an enlarged view of the semiconductor device shown in FIG. 4.

Referring to FIG. 7, each channel structure CS may include an information storage layer 120, a channel layer 130, and a buried insulating pattern 132. The channel layer 130 may be disposed inside the information storage layer 120. The buried insulating pattern 132 may be disposed inside the channel layer 130. The information storage layer 120 may include a tunnel insulating layer 122, a charge storage layer 124, and a blocking layer 126. The charge storage layer 124 may be disposed inside the blocking layer 126. The tunnel insulating layer 122 may be disposed inside the charge storage layer 124. In an example embodiment, the channel layer 130 may include polysilicon. The buried insulating pattern 132 may include silicon oxide, silicon nitride, silicon oxynitride, or a combination thereof. In an example embodiment the blocking layer 126 and the tunnel insulating layer 122 may include silicon oxide, whereas the charge storage layer 124 may include silicon nitride. The channel layer 130 may be electrically connected to a conductive pad 134.

A connecting conductive layer 43 may be disposed on an upper surface of a lower conductive layer 40, and may contact a side surface of the channel layer 130 while extending through the information storage layer 120. A portion of the connecting conductive layer 43, which contacts the channel layer 130, may extend in a vertical direction. A supporter 44 may be disposed on the connecting conductive layer 43.

Figure 8:
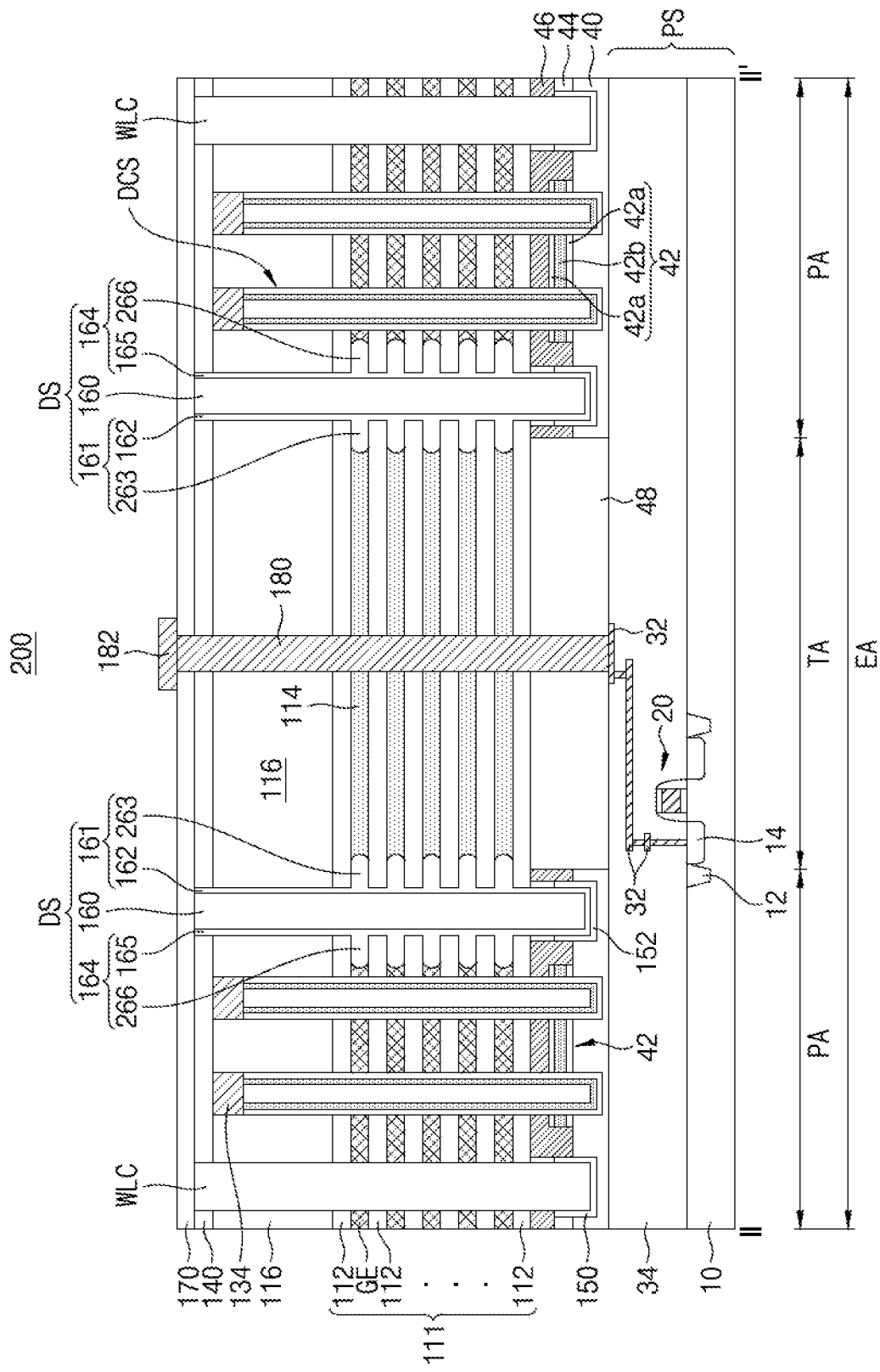
FIGS. 8-10 are vertical cross-sectional views taken along line II-II' of a semiconductor device according to an example embodiment of the inventive concepts.
Figure 9:
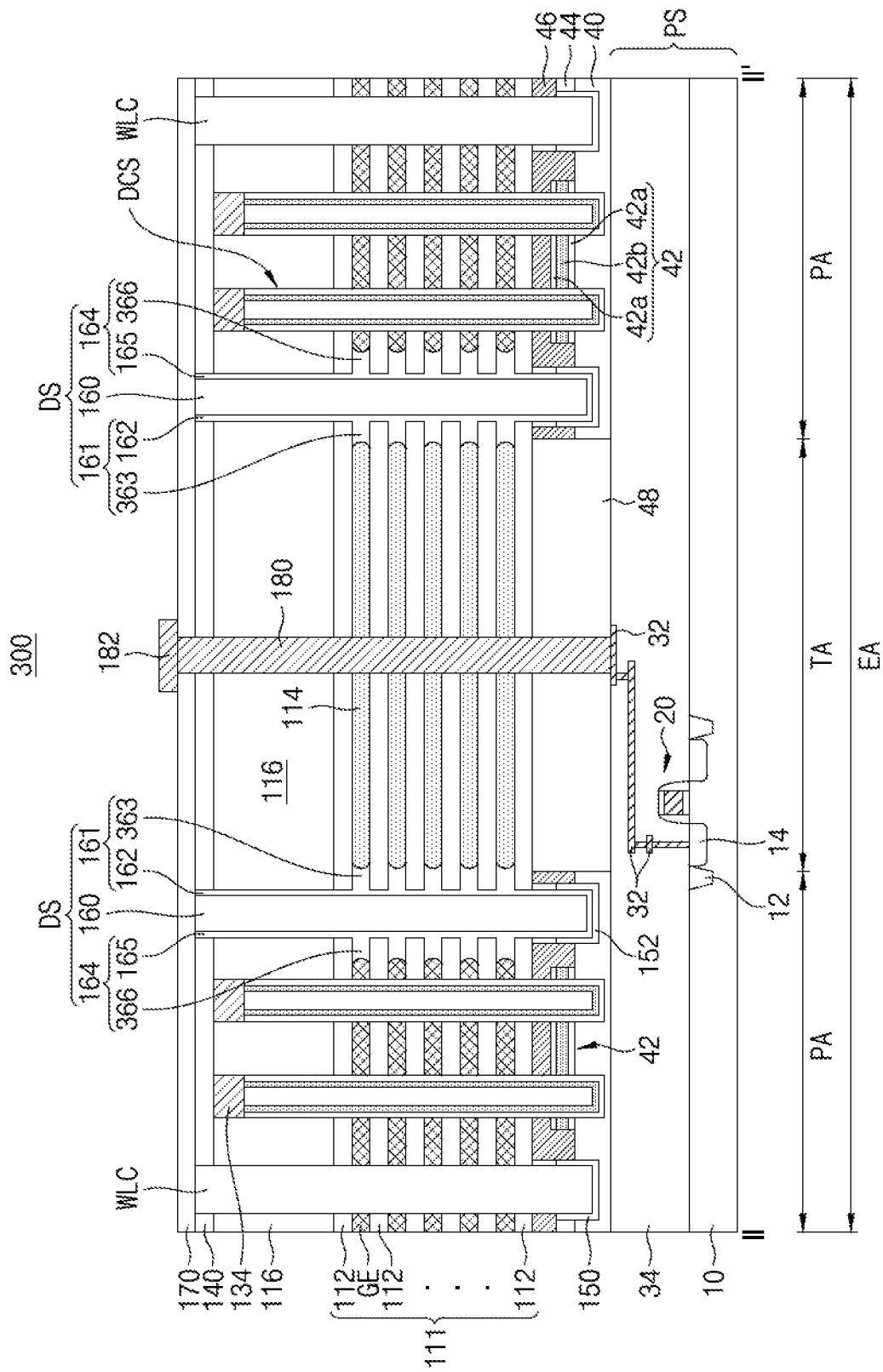
Figure 10:
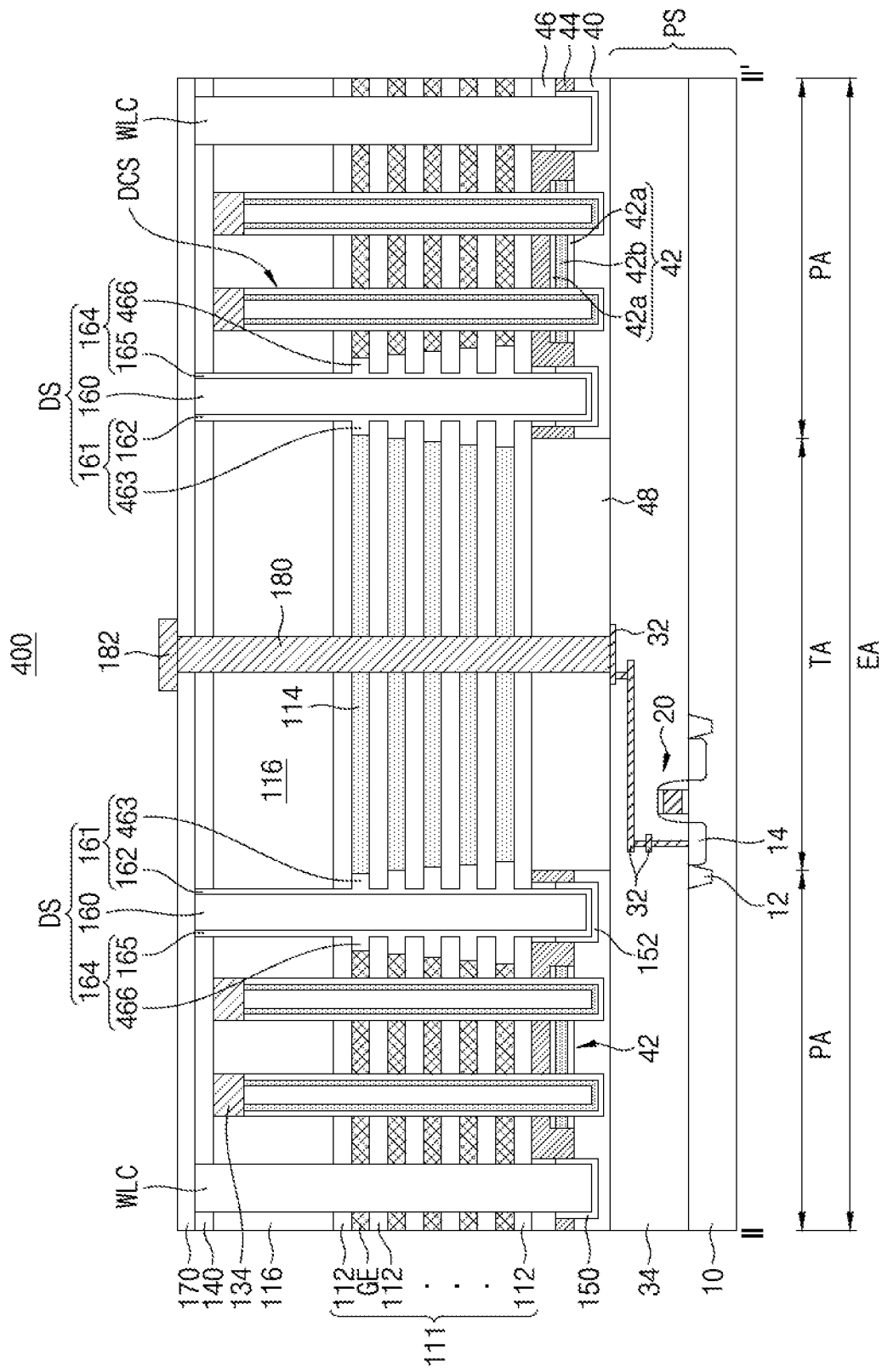

FIGS. 8-10 are vertical cross-sectional views taken along line II-II' of a semiconductor device according to example embodiments of the present inventive concepts.

Referring to FIG. 8, a dam structure DS of a semiconductor device 200 may include first protrusions 263 protruding in a horizontal direction and contacting corresponding mold layers 114, and second protrusions 266 protruding in the horizontal direction and contacting corresponding gate electrodes GE. In an example embodiment, cross-sections of the first protrusions 263 and the second protrusions 266 may have a convex shape at their terminal side. Cross-sections of the mold layers 114 contacting the first protrusions 263 may be concave, and cross-sections of the gate electrodes GE contacting the second protrusions 266 may be concave.

Referring to FIG. 9, a dam structure DS of a semiconductor device 300 may include first protrusions 363 protruding in a horizontal direction and contacting corresponding mold layers 114, and second protrusions 366 protruding in the horizontal direction contacting corresponding contact gate electrodes GE. In an example embodiment, cross-sections of the first protrusions 363 and the second protrusions 366 may be concave at their terminal side. Cross-sections of the mold layers 114 contacting the first protrusions 363 may be convex, and cross-sections of the gate electrodes GE contacting the second protrusions 366 may be convex.

Referring to FIG. 10, a dam structure DS of a semiconductor device 400 may include first protrusions 463 protruding in a horizontal direction and contacting corresponding mold layers 114, and second protrusions 466 protruding in the horizontal direction and contacting corresponding gate electrodes GE. In an example embodiment, the first protrusions 463 may have different horizontal widths. For example, a lower one of the first protrusions 463 may have a greater horizontal width than an upper one of the first protrusions 463. In an example embodiment, the second protrusions 466 may have different horizontal widths. For example, a lower one of the second protrusions 466 may have a greater horizontal width than an upper one of the second protrusions 466. Although each first protrusion 463 is illustrated as having the same horizontal width as a corresponding second protrusion 466 disposed at the same level as the first protrusion 463, in FIG. 10, the first protrusions 163 and the second protrusions 466 are not necessarily limited to the above-described condition. In an example embodiment, the horizontal width of at least one of the first protrusions 463 may be different from the horizontal width of at least one of the second protrusions 466 disposed at the same level as the at least one first protrusion 463.

FIGS. 11A-24B are vertical cross-sectional views illustrating a method of manufacturing a semiconductor device according to an example embodiment of the inventive concepts. FIGS. 11A, 12A, 13A, 14A, 15A, 16, 17A, 18A, 19A, 21A, 22A, 23A and 24A are vertical sectional views corresponding to the vertical cross-sectional view taken along line I-I' in FIG. 4. FIGS. 11B, 12B, 13B, 14B, 15B, 17B, 18B, 19B, 20, 21B, 22B, 23B and 24B are vertical sectional views corresponding to the vertical cross-sectional view taken along line II-II' in FIG. 4.

Figure 11A:
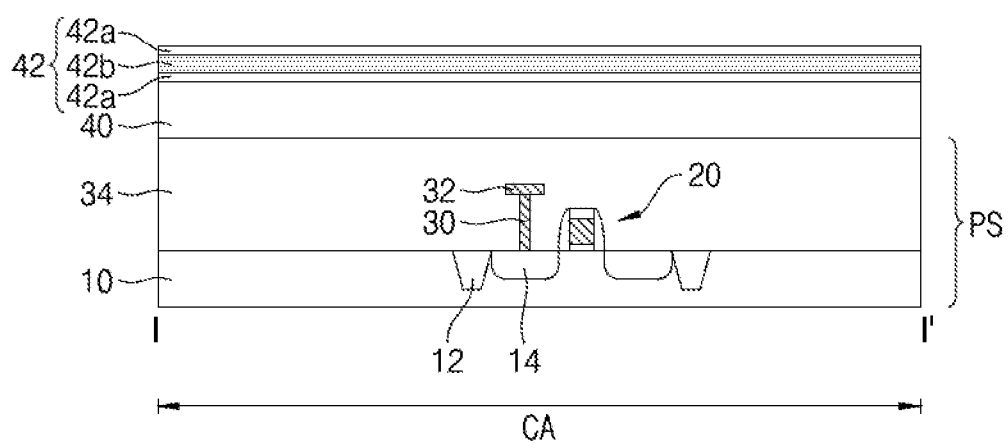
FIGS. 11A-24B are vertical cross-sectional views illustrating a method of manufacturing a semiconductor device according to an example embodiment of the inventive concepts.
Figure 11B:
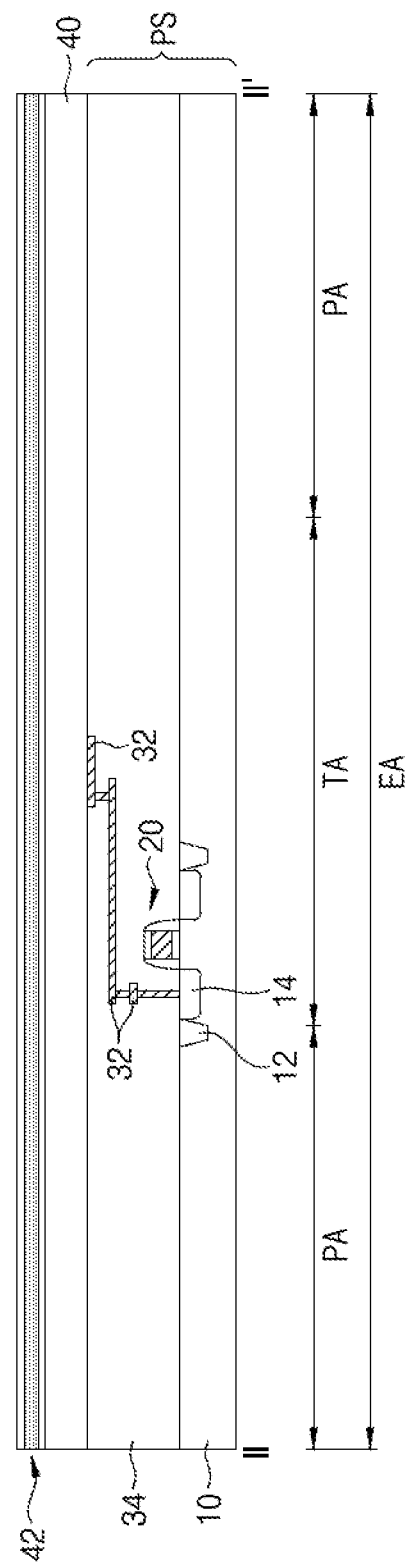

Referring to FIGS. 11A and 11B, a peripheral circuit structure PS, and a lower conductive layer 40 and a connecting mold layer 42 on the peripheral circuit structure PS may be formed. The peripheral circuit structure PS may include a substrate 10, a device isolation layer 12, an impurity region 14, a transistor 20, a contact plug 30, a peripheral circuit wiring 32, and a peripheral insulating layer 34. The device isolation layer 12 and the impurity region 14 may be formed at an upper surface of the substrate 10. In an example embodiment, the device isolation layer 12 may include an insulating material such as silicon oxide or silicon nitride. The impurity region 14 may include an n-type impurity or a p-type impurity. The transistor 20 may be disposed adjacent to the impurity region 14. The peripheral circuit wiring 32 may be disposed on the contact plug 30, and may be connected to the impurity region 14 through the contact plug 30. The peripheral insulating layer 34 may cover the transistor 20, the contact plug 30 and the peripheral circuit wiring 32.

The lower conductive layer 40 may be disposed on the peripheral circuit structure PS. The connecting mold layer 42 may be disposed on the lower conductive layer 40. The connecting mold layer 42 may include passivation layers 42a, and an insulating layer 42b disposed between an upper surface of one passivation layer 42a and a lower surface of the other passivation layer 42a.

The lower conductive layer 40 may include metal, metal nitride, metal silicide, metal oxide, conductive carbon, polysilicon, or a combination thereof. In an example embodiment, the lower conductive layer 40 may include a doped polysilicon layer. The connecting mold layer 42 may include a material having etch selectivity with respect to the lower conductive layer 40. The insulating layer 42b may include a material having etch selectivity with respect to the passivation layers 42a. In an example embodiment, the insulating layer 42b may include silicon oxide, and the passivation layers 42a may include silicon nitride.

Figure 12A:
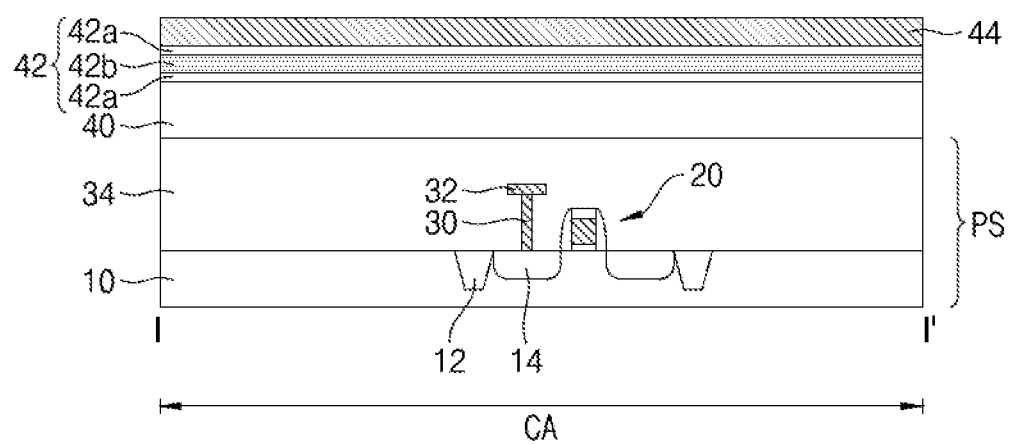
Figure 12B:
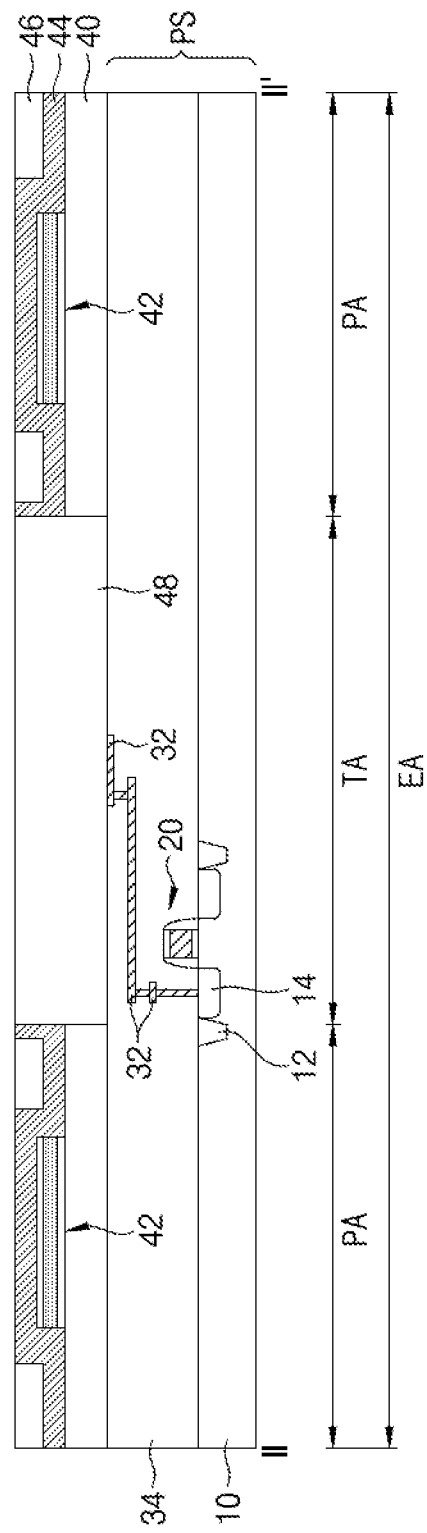

Referring to FIGS. 12A and 12B, a supporter 44, an isolation layer 46, and a buried insulating layer 48 may be formed. The connecting molding layer 42 may be partially removed from an extension area EA. After removal of a portion of the connecting mold layer 42, the supporter 44 may be deposited. In a cell array area CA, the supporter 44 may cover the connecting mold layer 42. In the extension area EA, the supporter 44 may cover the lower conductive layer 40 and the connecting mold layer 42. In an example embodiment, the supporter 44 may include polysilicon. The supporter 44 may have a recessed portion at an upper surface thereof. In order to fill the recessed portion, an insulating material may be deposited on the supporter 44. The insulating material may be planarized such that the upper surface of the supporter 44 is exposed. Accordingly, the isolation layer 46 which fills the recessed portion may be formed. An upper surface of the isolation layer 46 may be coplanar with the upper surface of the supporter 44.

The buried insulating layer 48 may be formed in a through electrode area TA. The buried insulating layer 48 may be formed by etching the lower conductive layer and the supporter 44 such that the peripheral circuit wiring 32 and the peripheral insulating layer 34 are exposed, and then depositing an insulating material. In an example embodiment, the buried insulating layer 48 may include silicon oxide, silicon nitride, silicon oxynitride, low-k dielectrics, high-k dielectrics, or a combination thereof. In an example embodiment, the buried insulating layer 48 may include silicon oxide.

Figure 13A:
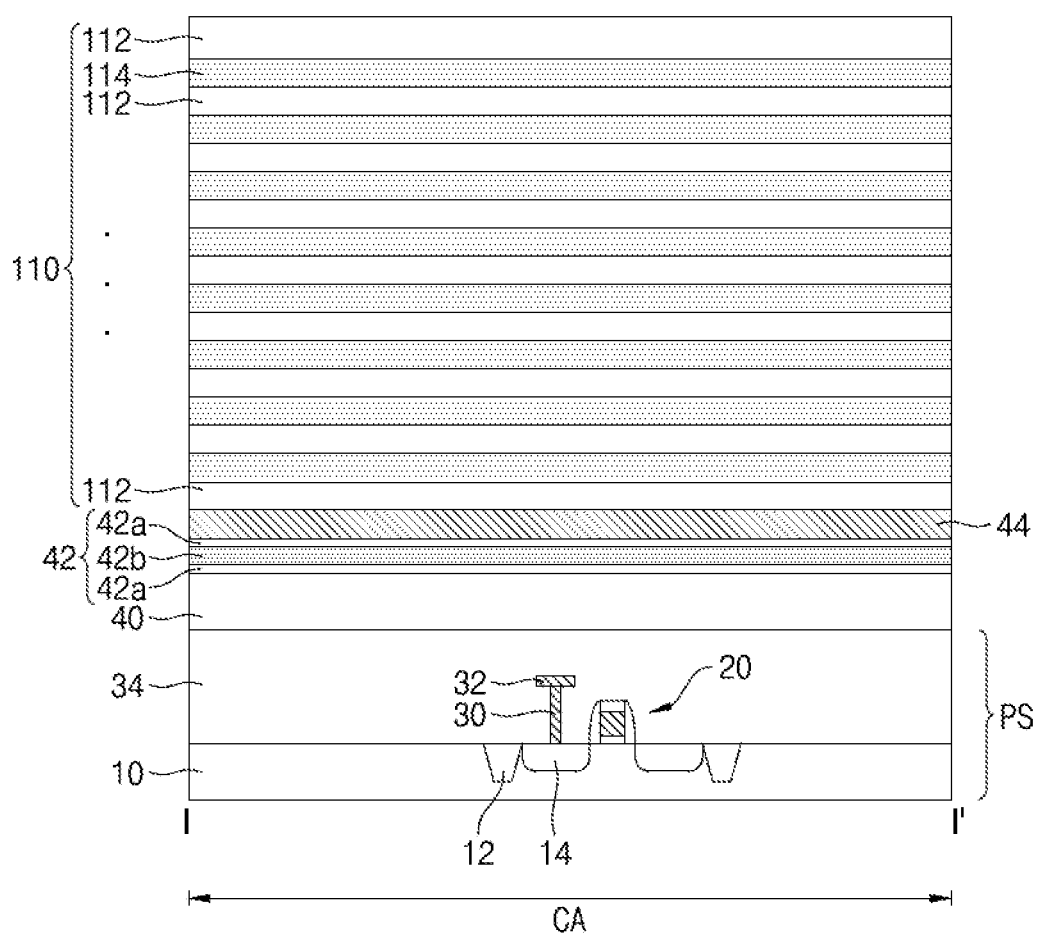
Figure 13B:
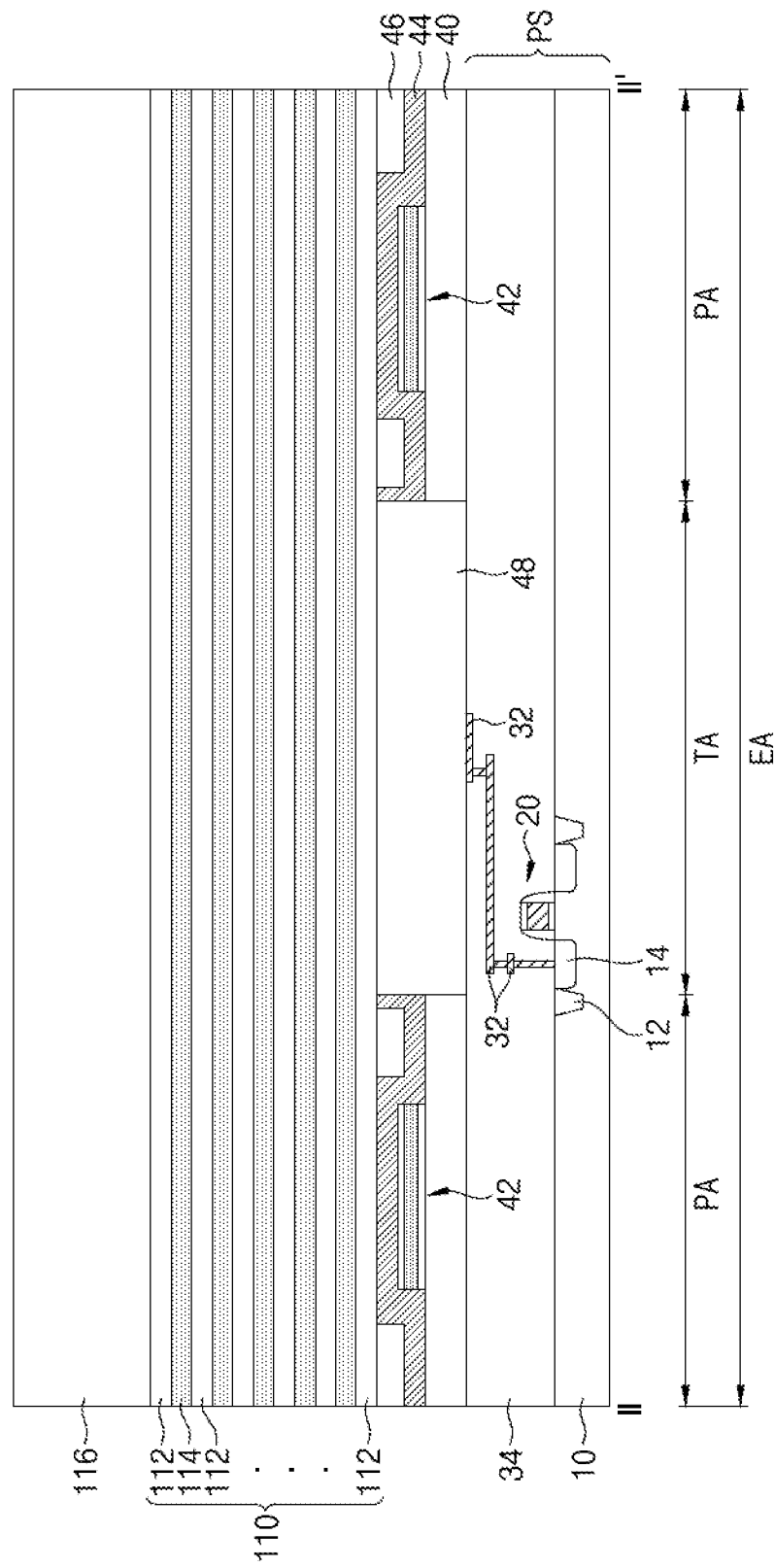

Referring to FIGS. 13A and 13B, a mold stack 110 and an interlayer insulating layer 116 may be formed on the structure of FIGS. 12A and 12B. The mold stack 110 may include alternately stacked insulating layers 112 and mold layers 114. The insulating layers 112 may include a material having etch selectivity with respect to the mold layers 114. In an example embodiment, the insulating layers 112 may include silicon oxide, and the mold layers 114 may include silicon nitride.

The mold stack 110 may be trimmed to have a stepped structure in the extension area EA. The interlayer insulating layer 116 may cover the stepped structure. The interlayer insulating layer 116 may include silicon oxide, silicon nitride, silicon oxynitride, low-k dielectrics, high-k dielectrics, or a combination thereof. In an example embodiment, the interlayer insulating layer 116 may include silicon oxide.

Figure 14A:
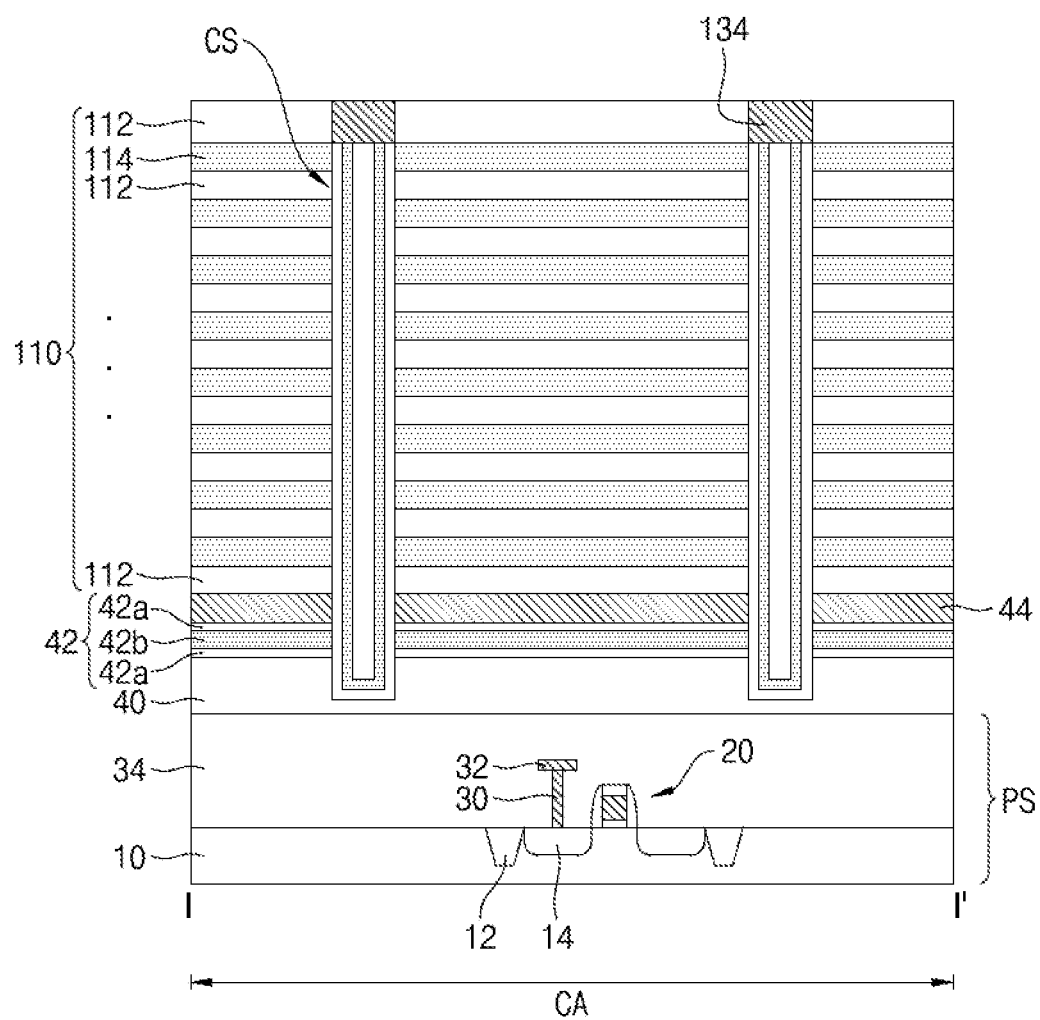
Figure 14B:
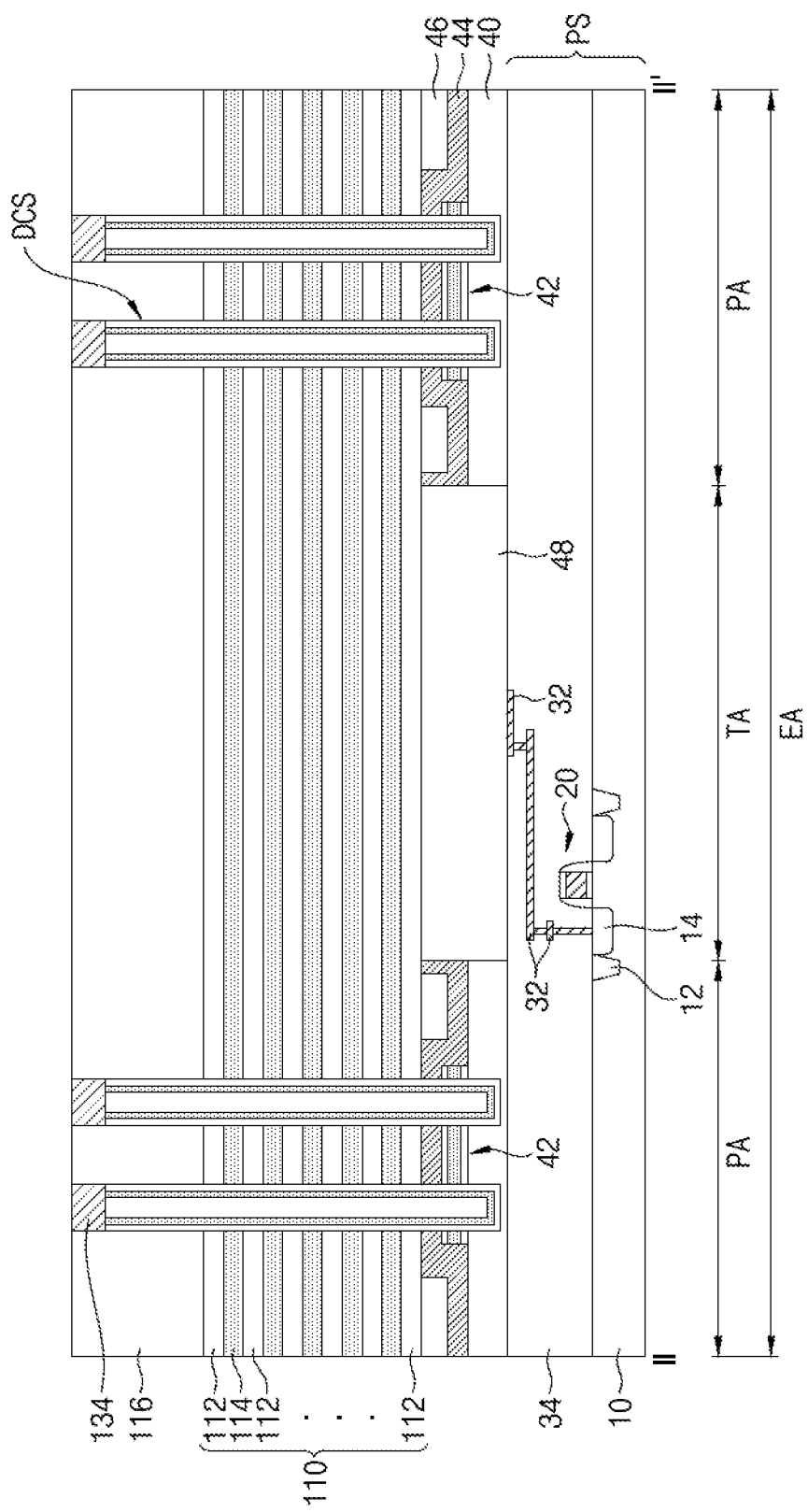
Figure 15A:
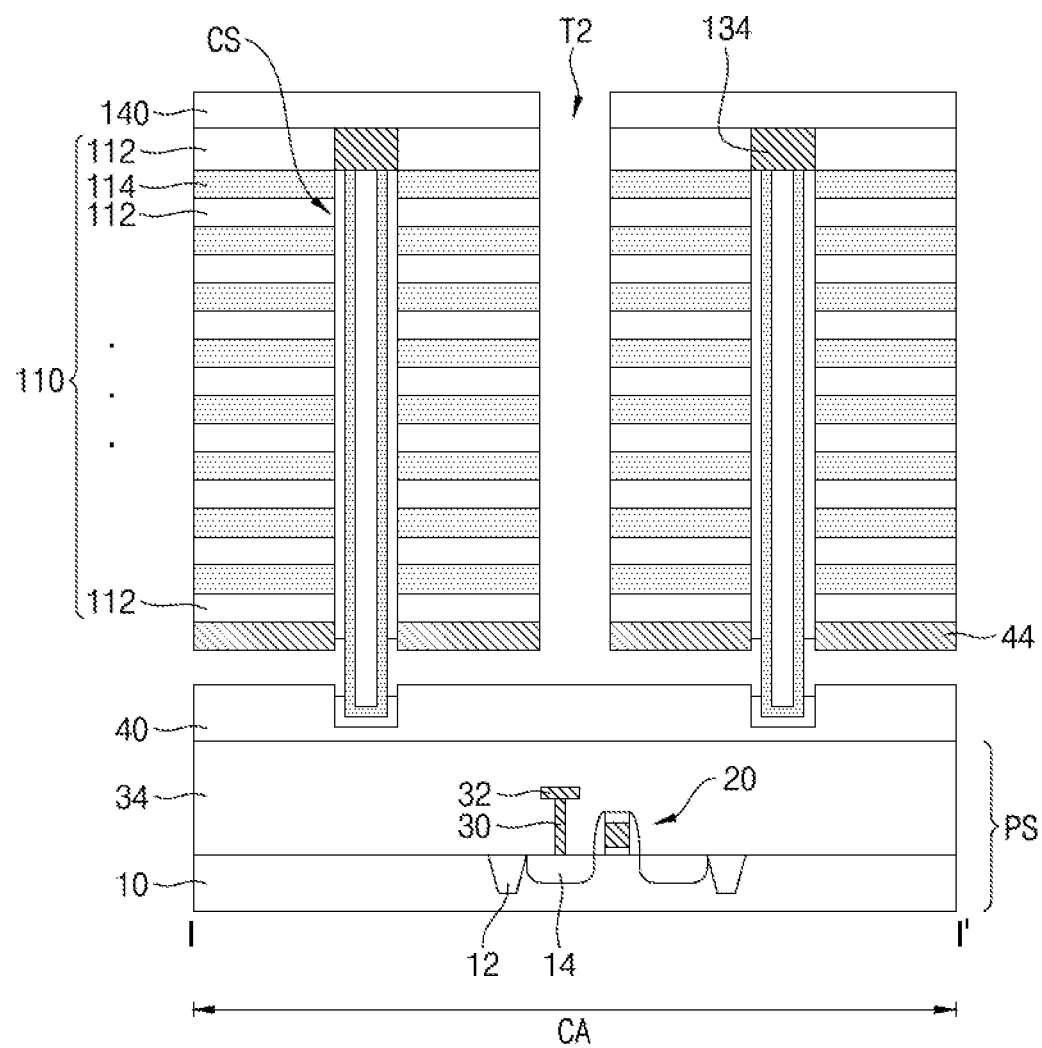
Figure 15B:
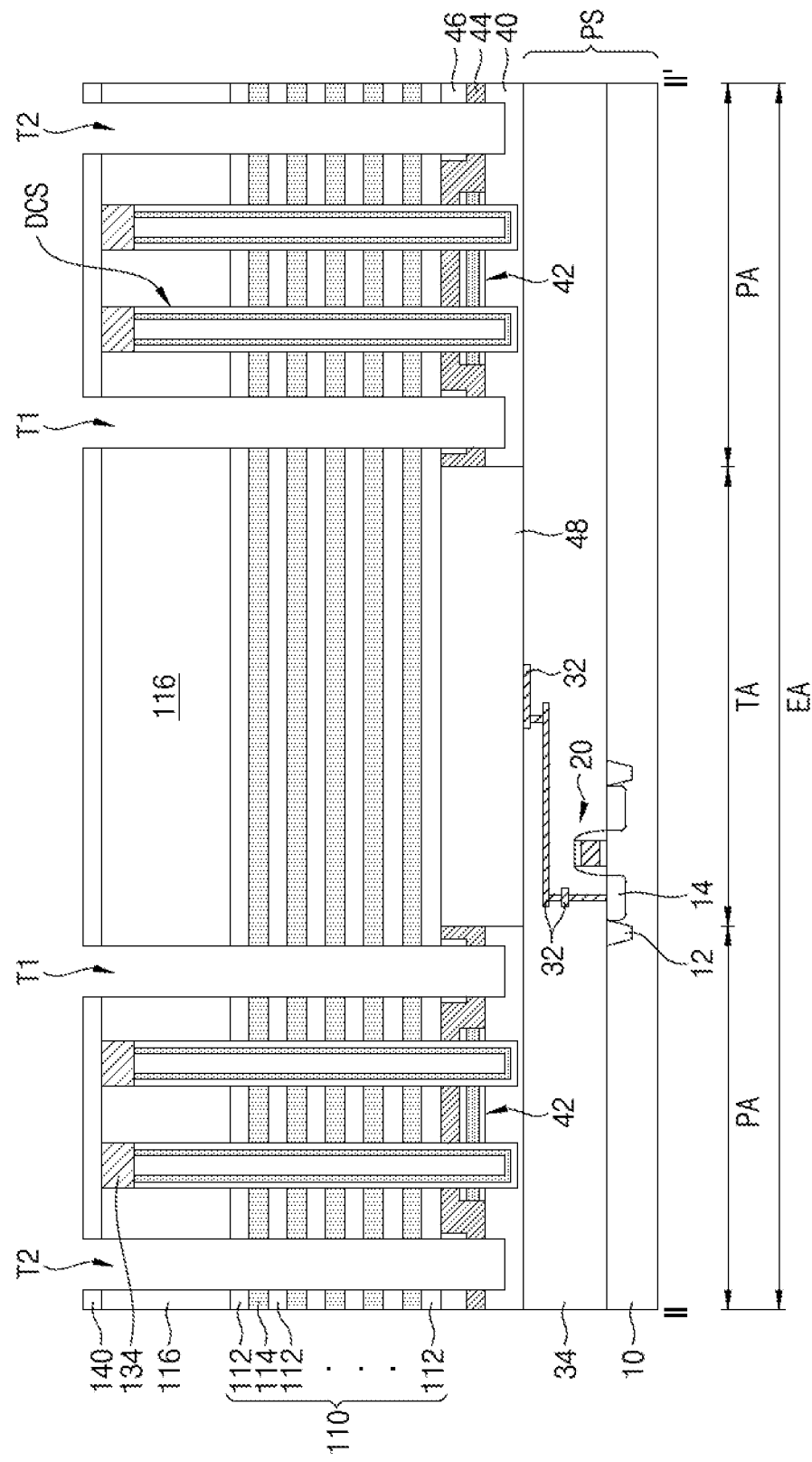

Referring to FIGS. 14A and 14B, channel structures CS and dummy channel structures DCS may be formed. The channel structures CS may be made by forming channel holes extending through the connecting mold layer 42, the supporter 44 and the mold stack 110 in the cell array area CA, and then depositing an information storage layer 120, a channel layer 130 and a buried insulating pattern 132 in the channel holes (cf. FIG. 7). The dummy channel structures DCS may have substantially the same structure as the channel structures CS. The dummy channel structures DCS may extend through the connecting mold layer 42, the supporter 44, the mold stack 110 and the interlayer insulating layer 116 in the extension area EA.

A conductive pad 134 may be disposed on a top portion of each channel structure CS. The conductive pad 134 may include a conductive layer made of metal, metal nitride, metal oxide, metal silicide, conductive carbon, polysilicon, or a combination thereof Referring to FIGS. 15A and 15B, a first upper insulating layer 140 may be deposited on the structure of FIGS. 14A and 14B, and a first isolation trench T1 and a second isolation trench T2 extending vertically through the mold stack 110 and the first upper insulating layer 140 may be formed through an anisotropic etching process. The first upper insulating layer 140 may be disposed on the mold stack 110, and may include silicon oxide, silicon nitride, silicon oxynitride, or a combination thereof. The first isolation trench T1 may be formed around a through electrode area TA, and the second isolation trench T2 may be formed to extend from the cell array area CA to the extension area EA.

The second isolation trench T2 may expose the connecting mold layer 42 in the cell array area CA and the connecting mold layer 42 may be selectively removed. Removing the connecting mold layer 42 may be performed by an isotropic etching process. Through removal of the connecting mold layer 42, a side surface of each channel structure CS may be partially exposed. The information storage layer 120 of the channel structure CS may be selectively etched and the channel layer 130 of the channel structure CS may be exposed. When removing the connecting mold layer 42 and the information storage layer 120, spacers for preventing the mold stack 110 from being etched may be formed at side surfaces of the first isolation trench T1 and the second isolation trench T2.

Figure 16:
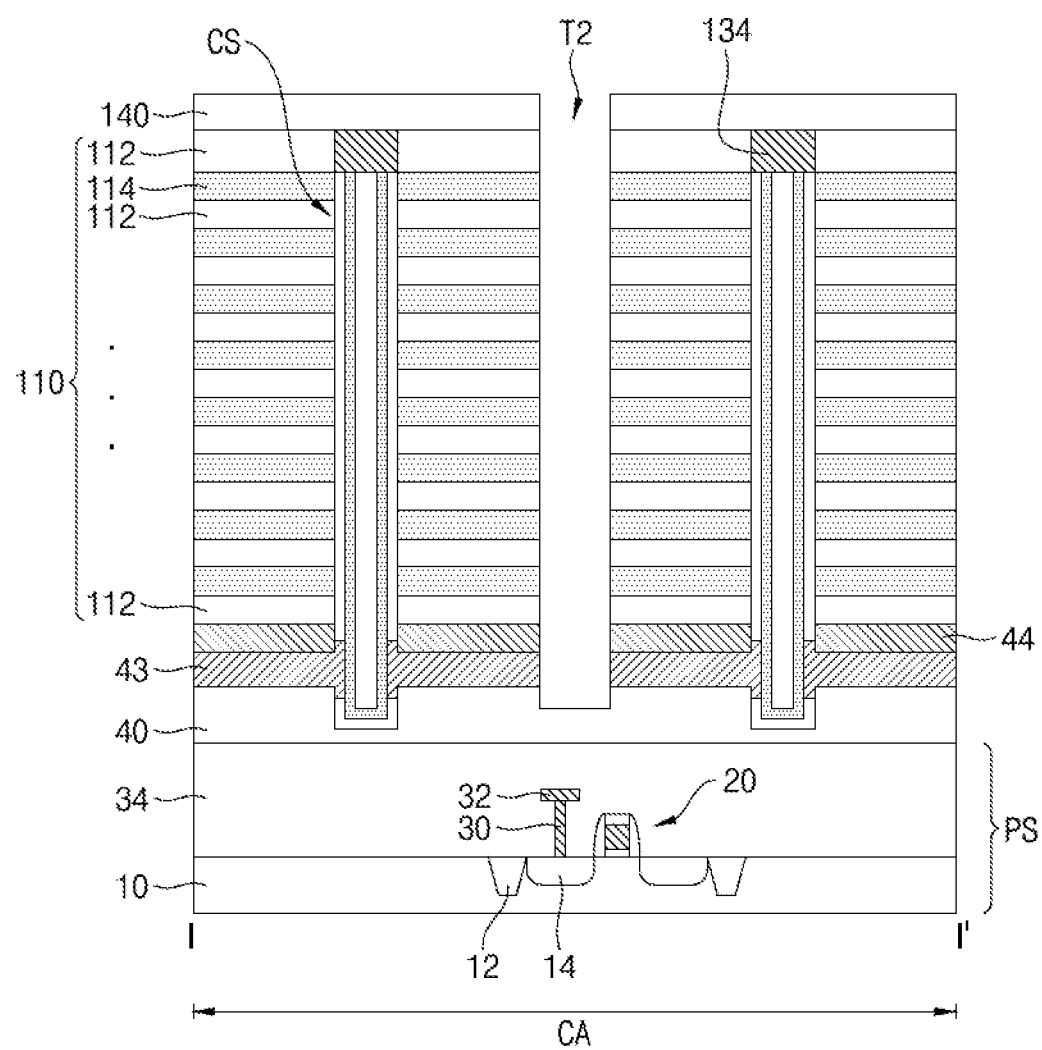

Referring to FIG. 16, a connecting conductive layer 43 may be formed by depositing a conductive material in a space where the connection mold layer 42 is removed. As shown in FIG. 7, the connecting conductive layer 43 may be disposed between the lower conductive layer 40 and the supporter 44 while contacting the channel layer 130. After forming the connecting conductive layer 43, an anisotropic etching process may be further performed to remove the conductive material formed along the first isolation trench T1 and the second isolation trench T2. The connecting conductive layer 43 may include metal, metal nitride, metal oxide, metal silicide, polysilicon, conductive carbon, or a combination thereof. In an example embodiment, the connecting conductive layer 43 may include polysilicon.

Figure 17A:
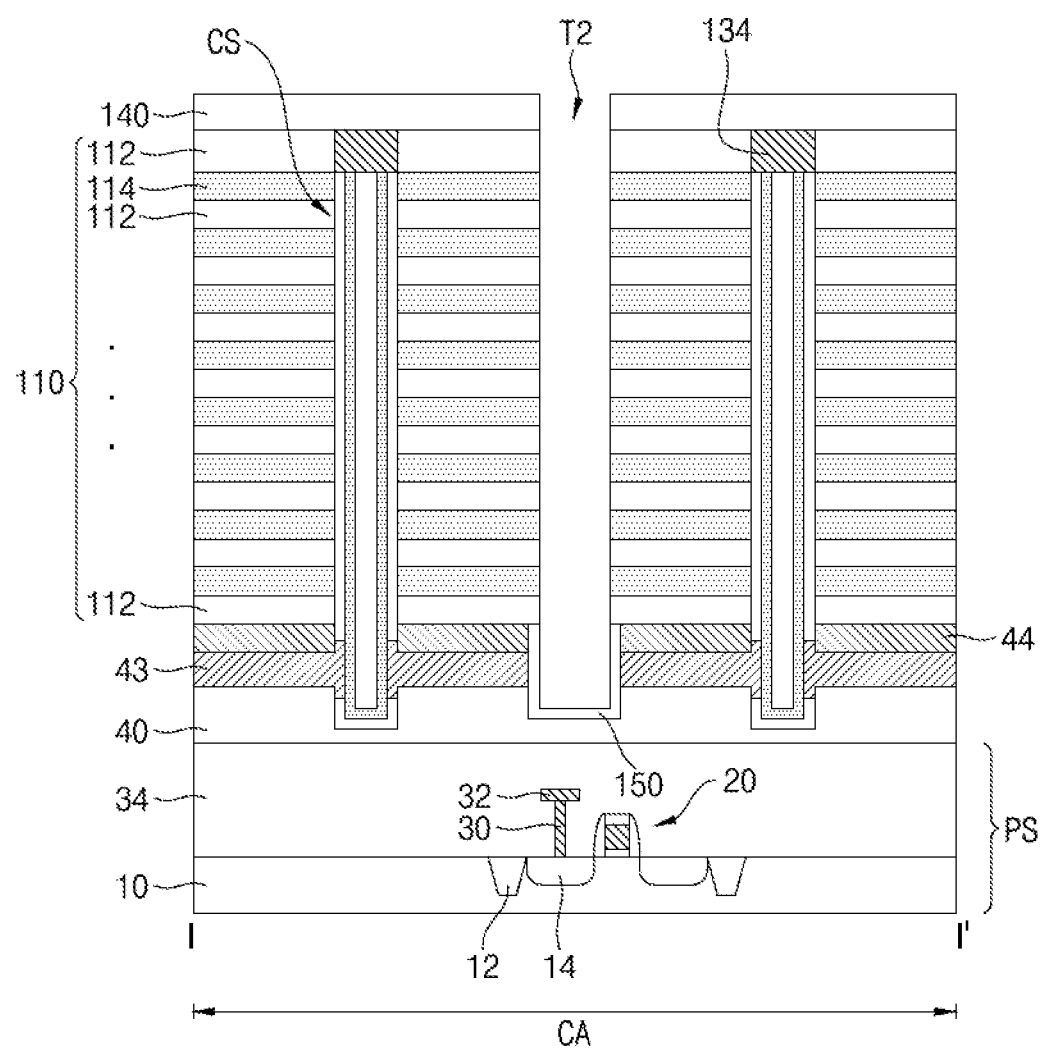
Figure 17B:
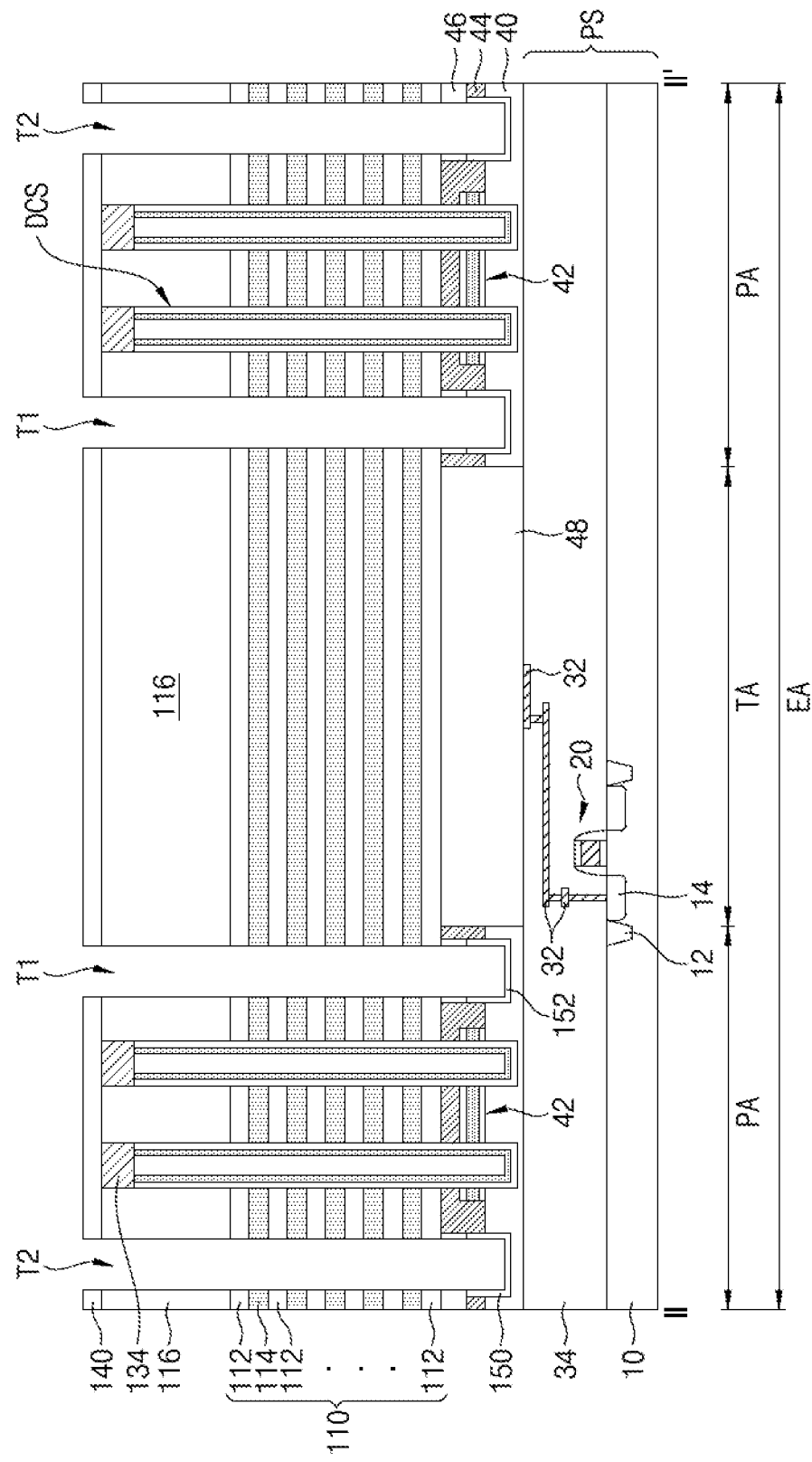

Referring to FIGS. 17A and 17B, a first lower oxide layer 150 and a second lower oxide layer 152 may be formed by an oxidation process. The oxidation process may be a dry oxidation process. The first lower oxide layer 150 may be formed by oxidizing surfaces of the lower conductive layer 40, the connecting conductive layer 43, and the supporter 44 exposed by the second trench T2. The second lower oxide layer 152 may be formed by oxidizing surfaces of the lower conductive layer 40, the connecting conductive layer 43 and the supporter 44 exposed by the first isolation trench T1. The first lower oxide layer 150 and the second lower oxide layer 152 may be disposed at lower portions of the first isolation trench T1 and the second isolation trench T2, respectively. In an example embodiment, the lower conductive layer 40 might not be exposed by the first isolation trench T1 and the second isolation trench T2, and the first lower oxide layer 150 and the second oxide layer 152 may be formed by oxidizing surfaces of the connecting conductive layer 43 and the supporter 44.

Figure 18A:
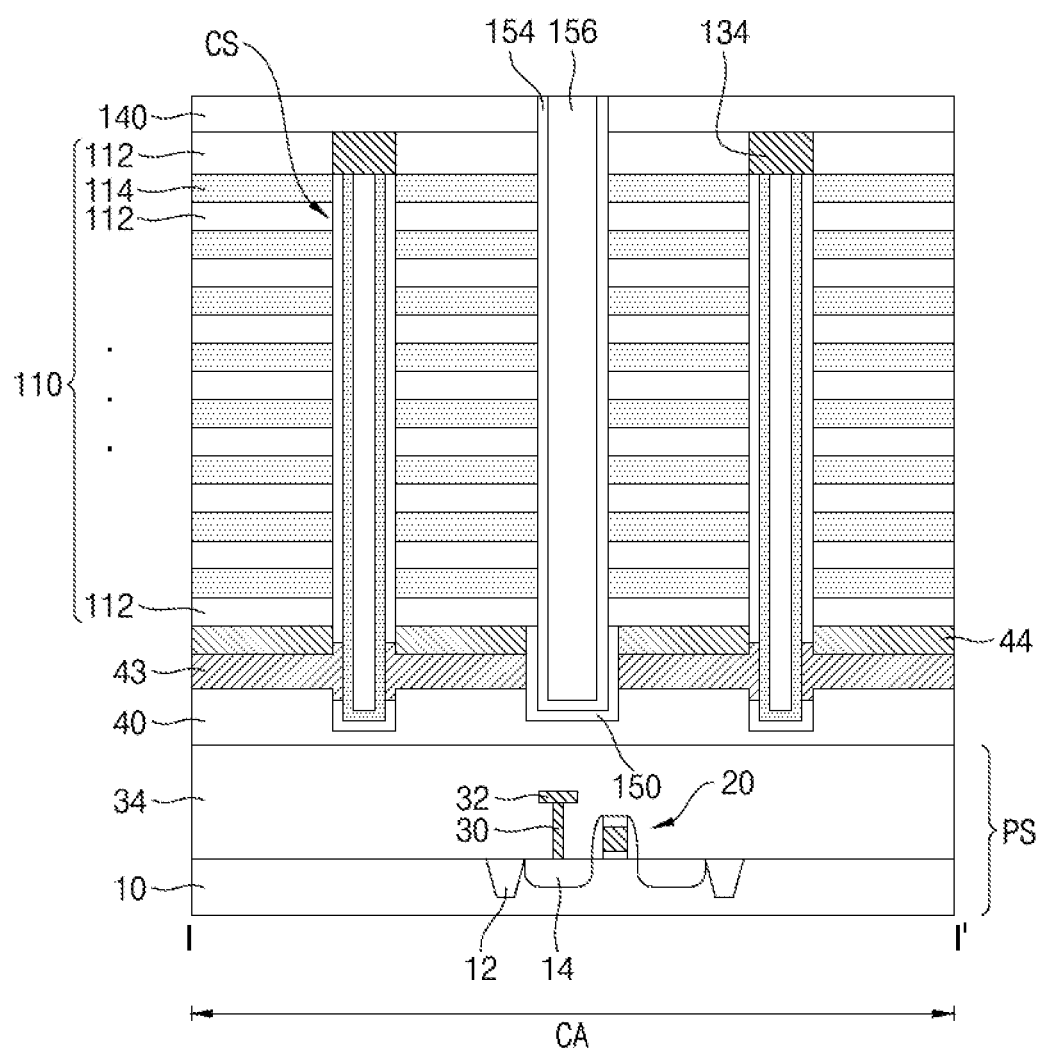
Figure 18B:
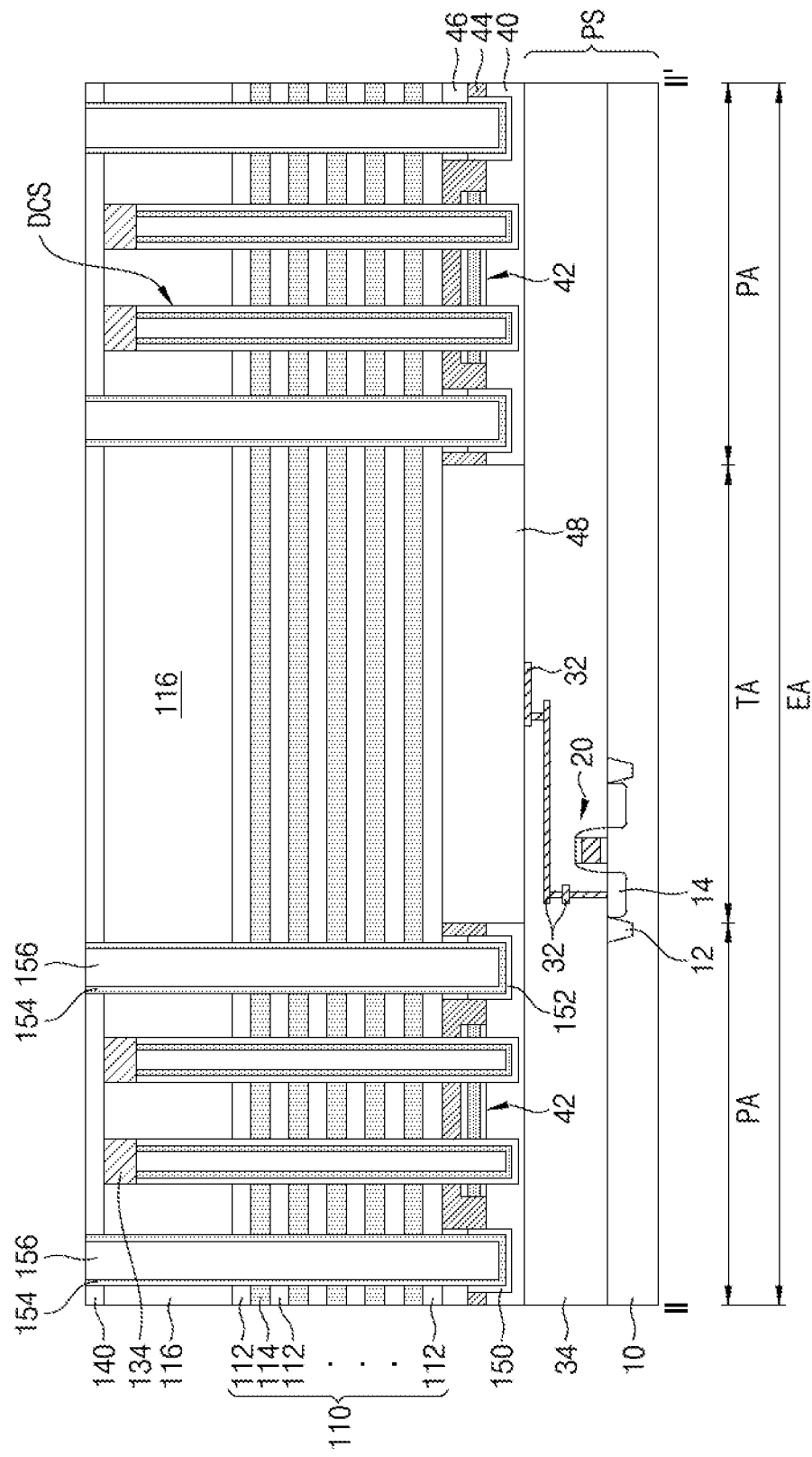

Referring to FIGS. 18A and 18B, a first sacrificial material 154 and a second sacrificial material 156 may fill the first isolation trench T1 and the second isolation trench T2. The first sacrificial material 154 may be formed by depositing an insulating material along inner walls of the first isolation trench T1 and the second isolation trench T2. The second sacrificial material 156 may be formed by depositing an insulating material on the first sacrificial material 154 such that the insulating material fills the first isolation trench T1 and the second isolation trench T2. After deposition of the insulating materials, the first sacrificial material 154 and the second sacrificial material 156 may be planarized. Upper surfaces of the first sacrificial material 1545 and the second sacrificial material 156 may be coplanar with an upper surface of the first upper insulating layer 140. In an example embodiment, the first sacrificial material 154 may include silicon nitride, and the second sacrificial material 156 may include polysilicon. In an example embodiment, the first sacrificial material 154 may be omitted, and the second sacrificial material 156 may fill the first isolation trench T1 and the second isolation trench T2.

Figure 19A:
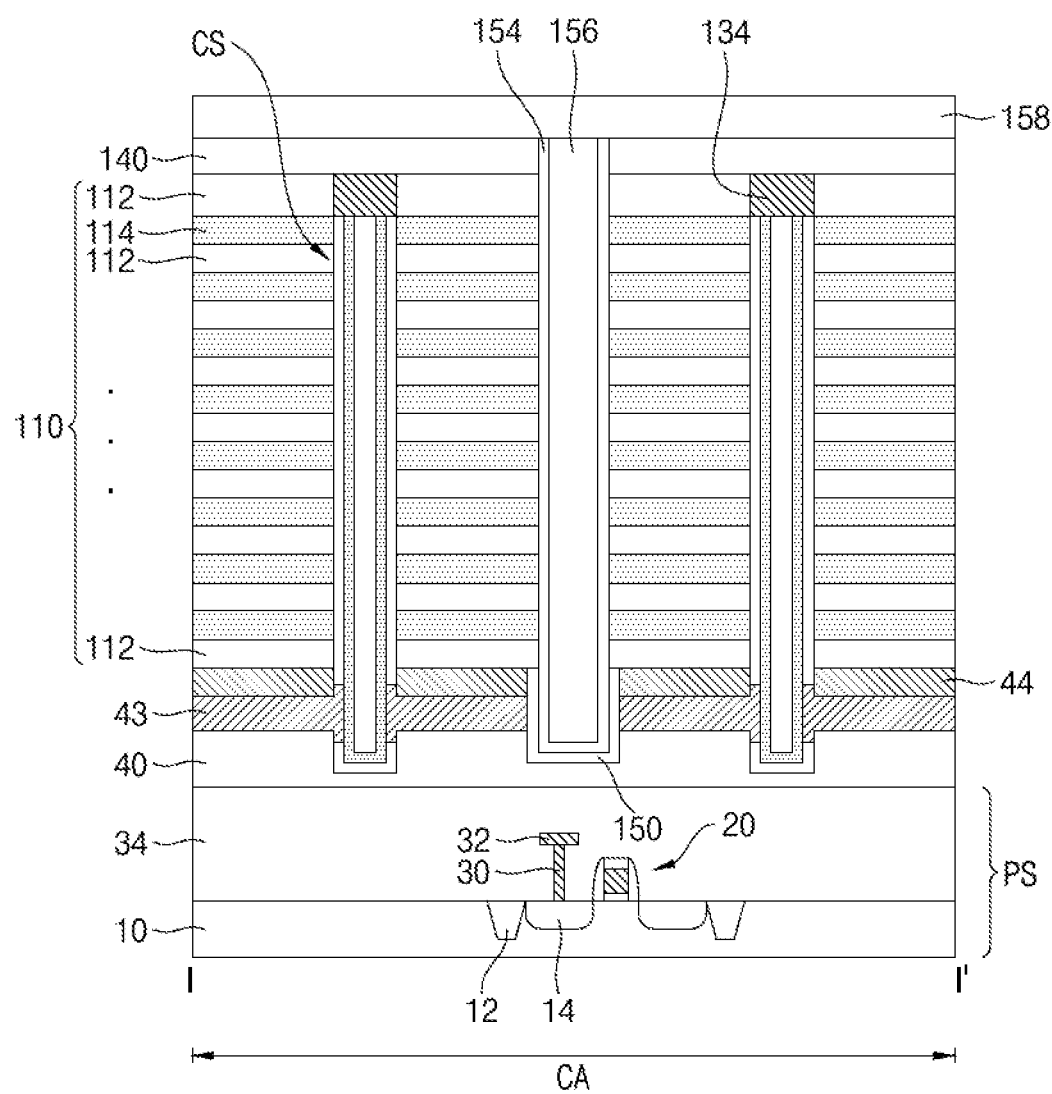
Figure 19B:
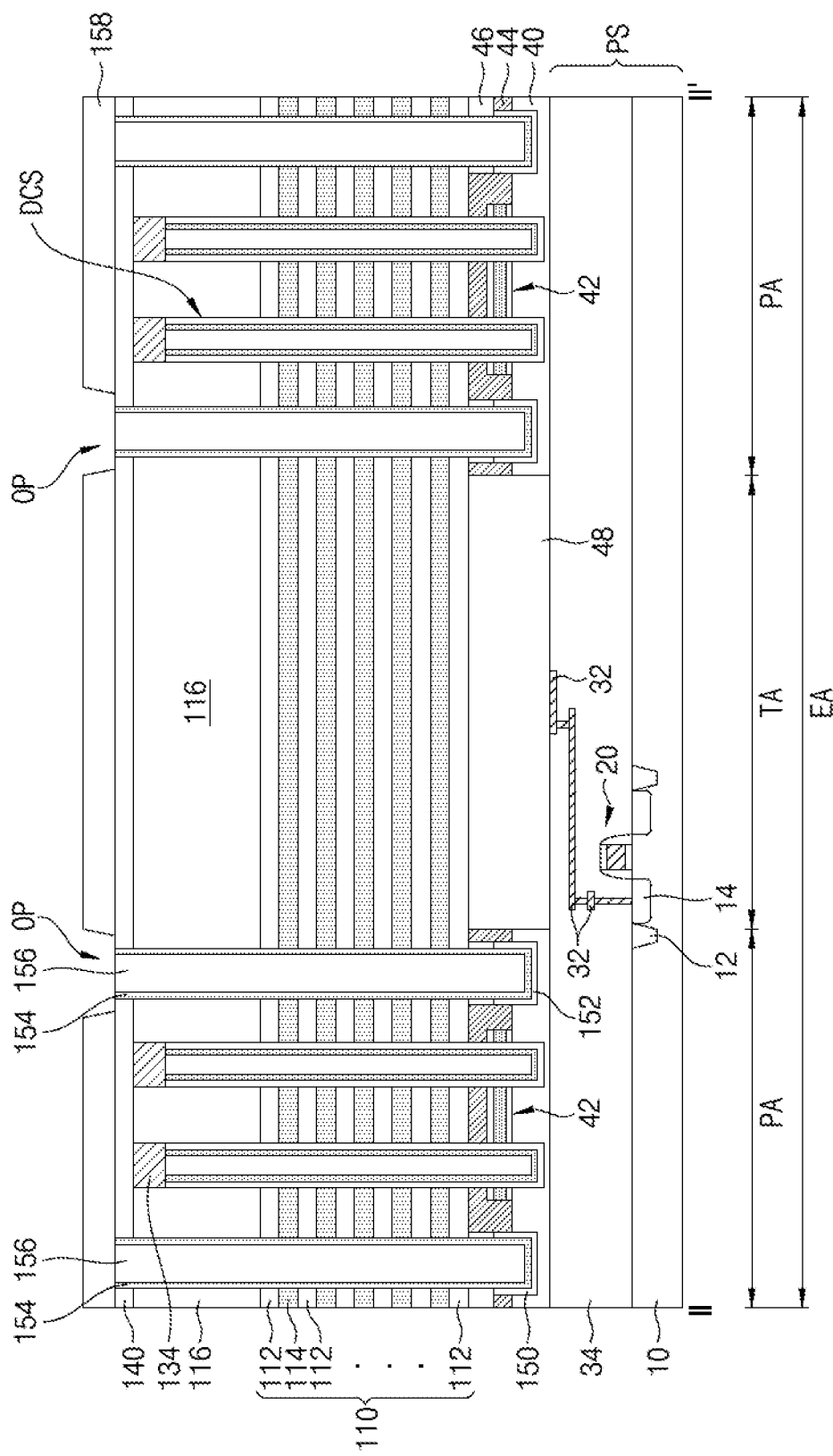

Referring to FIGS. 19A and 19B, an insulating layer 158 may be formed on the structure of FIGS. 18A and 18B. The insulating layer 158 may include openings OP exposing the first sacrificial material 154 and the second sacrificial material 156, which correspond to the first isolation trench T1. In an example embodiment, the insulating layer 158 may include silicon oxide.

Figure 20:
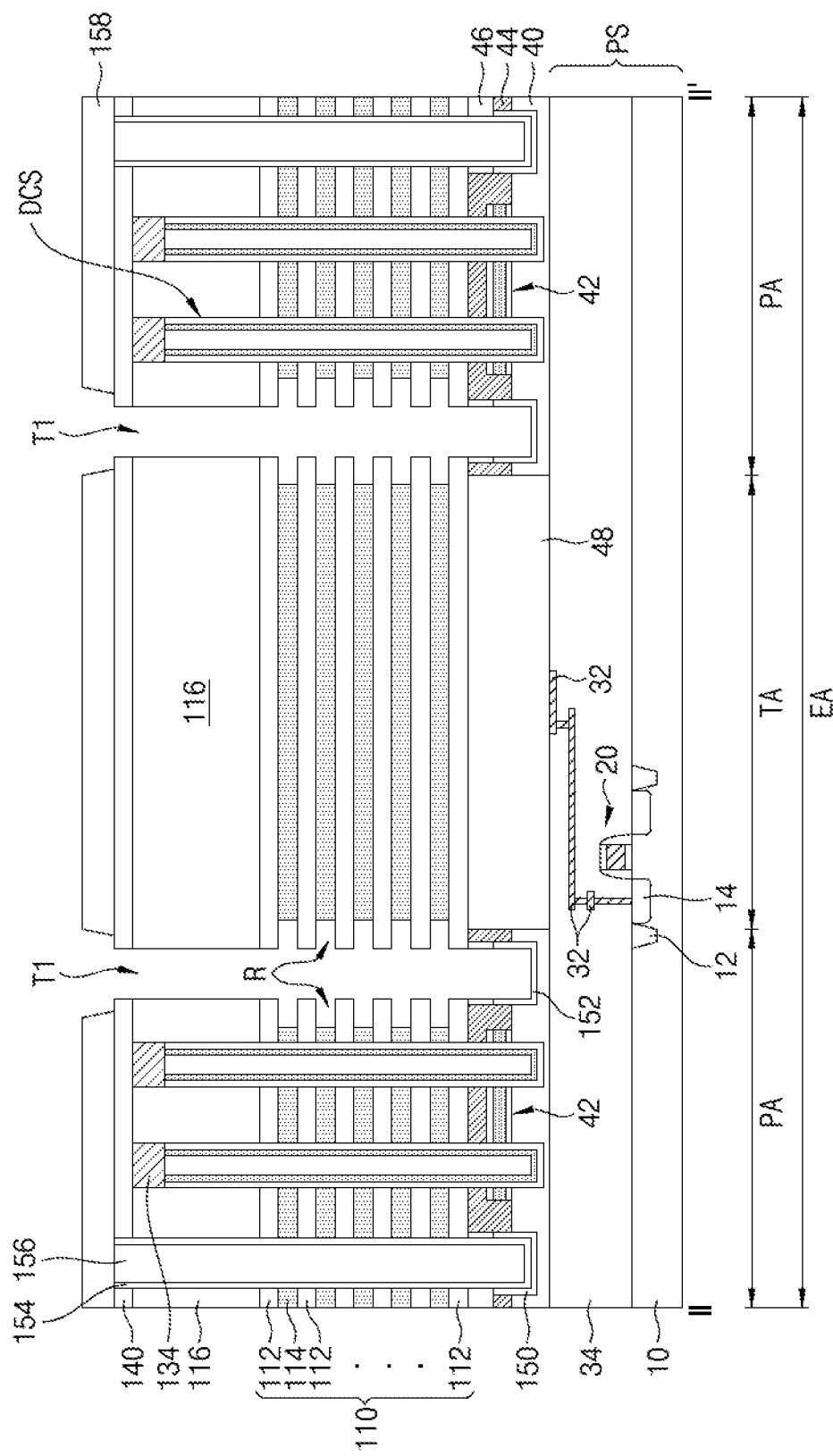

Referring to FIG. 20, the first sacrificial material 154 and the second sacrificial material 156 may be removed by an etching process. The insulating layers 112 and the mold layers 114 of the mold stack 110 may be exposed by the etching process. Exposed portions of the mold layers 114 may be etched in a horizontal direction by an isotropic etching process and recesses R may be formed. In an example embodiment a horizontal width of the recesses R may be 0 to 100 nm.

Figure 21A:
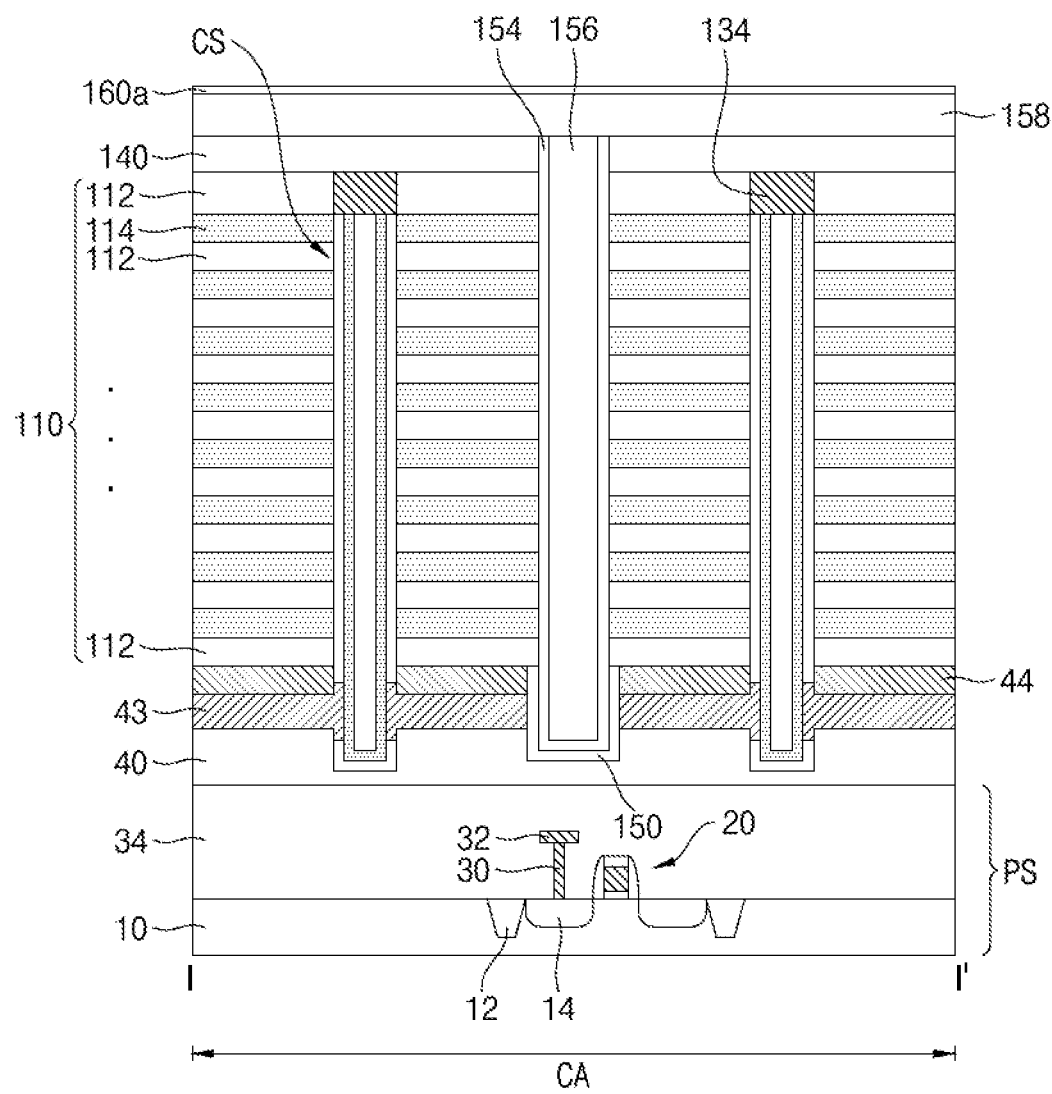
Figure 21B:
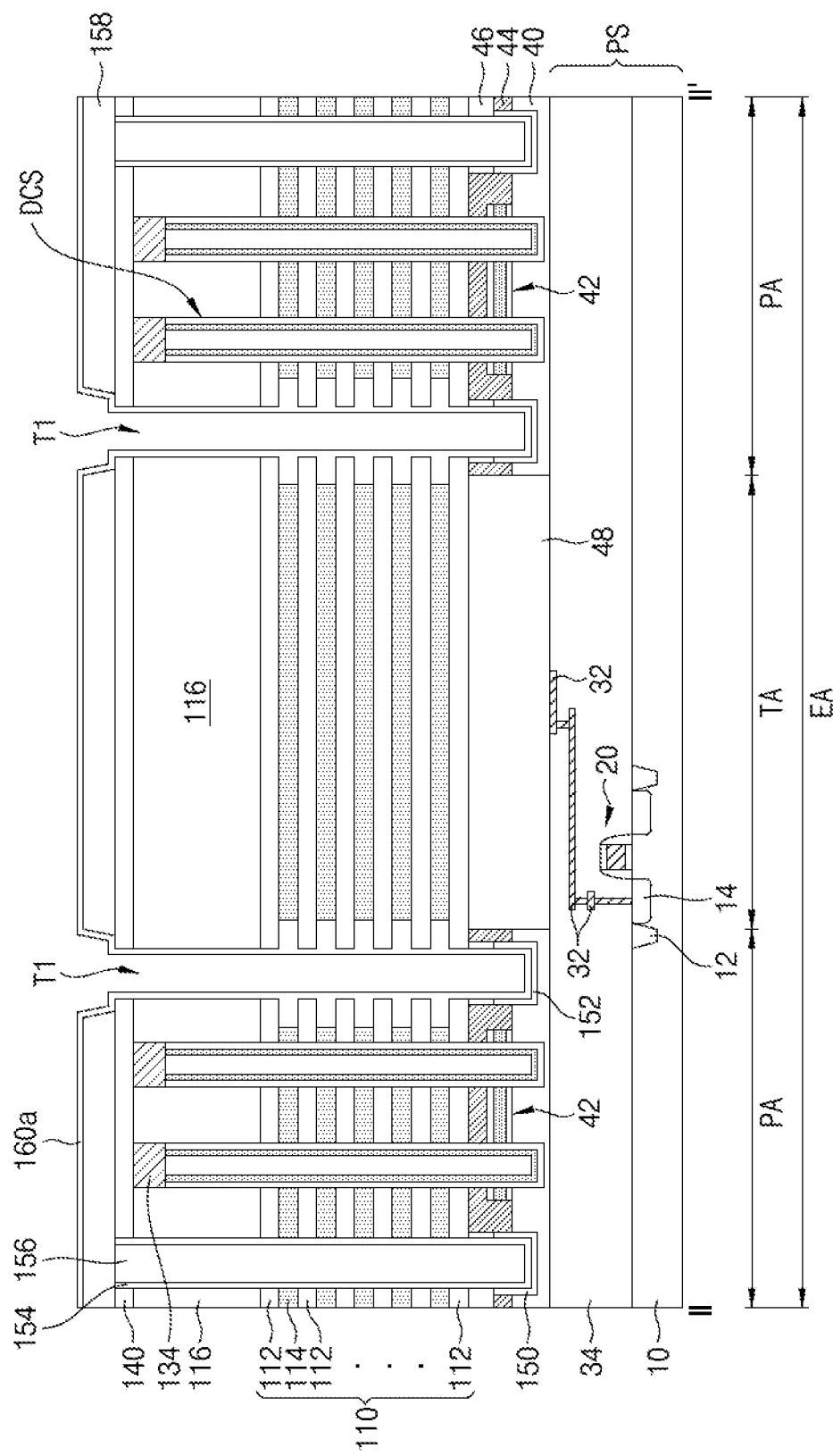

Referring to FIGS. 21A and 21B, a dam insulating material 160a may be deposited on the structure of FIG. 20. Deposition of the dam insulating material 160a may include an atomic layer deposition (ALD) process. The dam insulating material 160a may fill the recesses R, and may be formed along surfaces of the interlayer insulating layer 116, the second lower oxide layer 152, the first upper insulating layer 140 and the insulating layer 158.

Figure 22A:
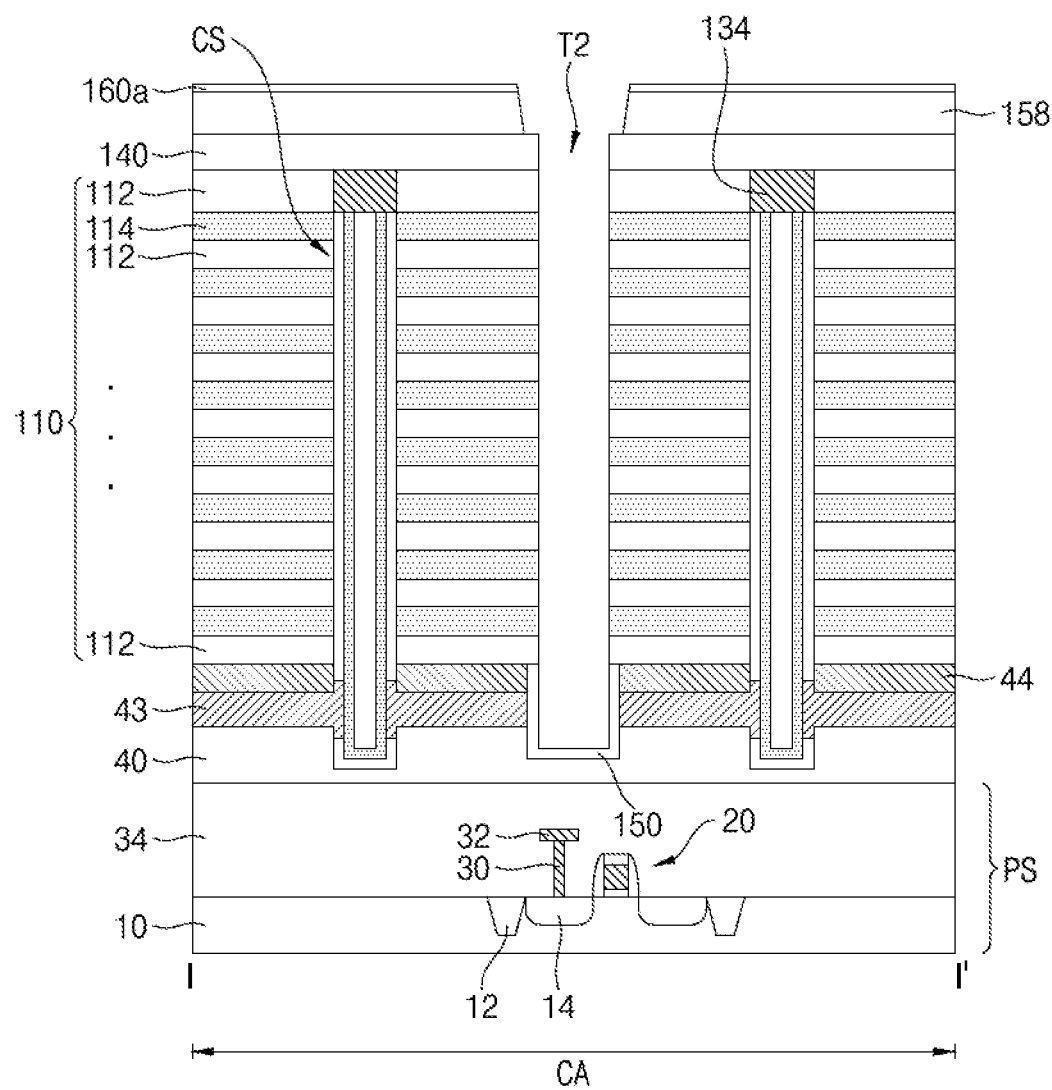
Figure 22B:
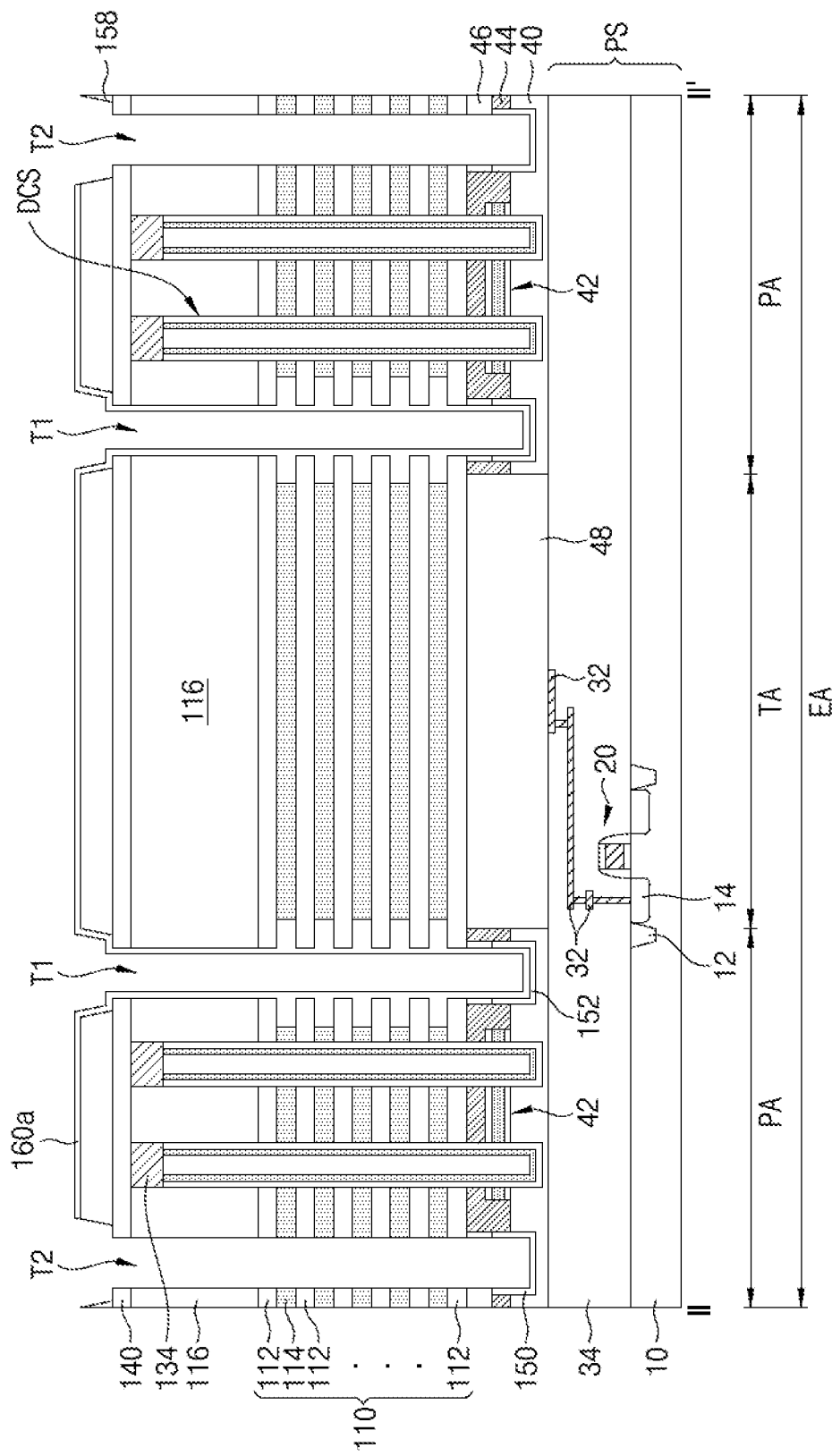

Referring to FIGS. 22A and 22B, portions of the dam insulating material 160a and the insulating layer 158 corresponding to the second isolation trench T2 may be etched. The etching process may include forming a hard mask on the resultant structure of FIGS. 21A and 21B, and then etching a portion of the hard mask corresponding to the second isolation trench T2 through a patterning process. By the etching process, the sacrificial material 154 and the second sacrificial material 156 filling the second isolation trench T2 may be exposed, and may then be removed to expose the insulating layers 112 and the mold layers 114 of the mold stack 110.

Figure 23A:
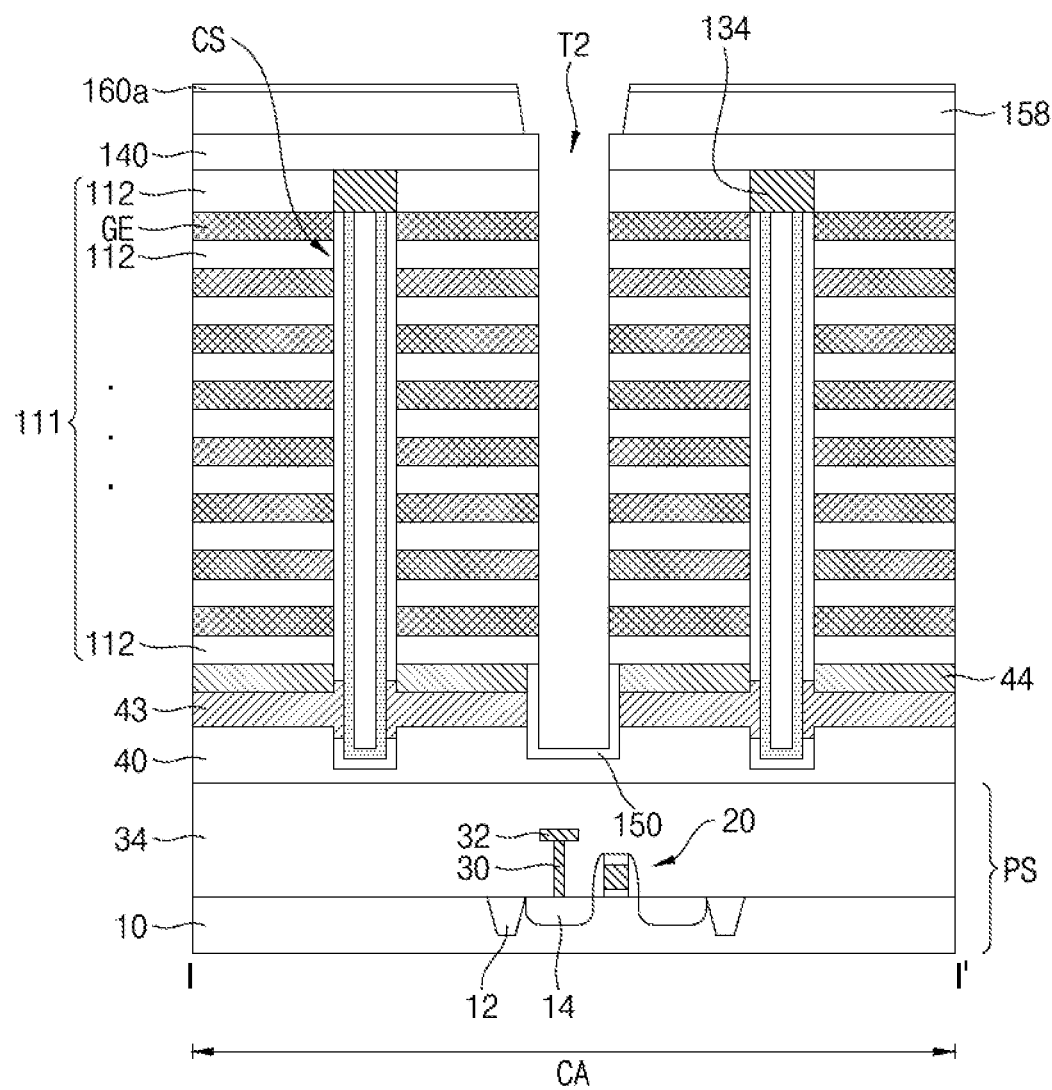
Figure 23B:
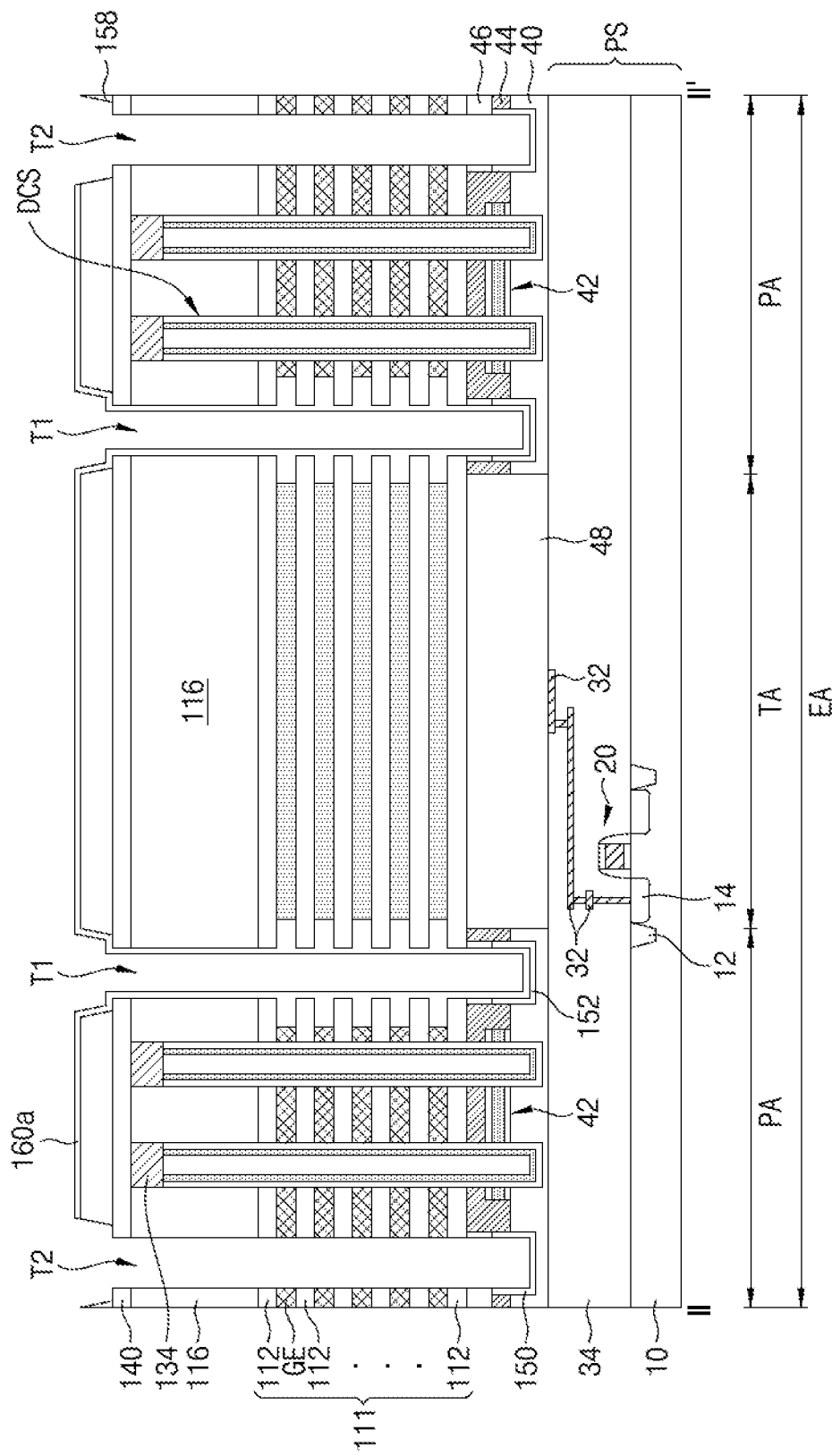

Referring to FIGS. 23A and 23B, the mold layers 114 exposed by the second isolation trench T2 may be removed. In the extension area EA, the mold layers 114 may be removed through an isotropic etching process. By-products of the etching process may be discharged into the second isolation trench T2 and portions of the dam insulating material 160a filling respective recesses R, which correspond to respective second protrusions 166 of FIG. 6, may be exposed.

Gate electrodes GE may be formed by a deposition process, and may be formed in a space where the mold layers 114 are removed. The gate electrodes GE may contact the dam insulating material 160a disposed between the insulating layers 112. After formation of the gate electrodes GE, an isotropic etching process may be further performed along the second isolation trench T2. The gate electrodes GE may be disposed alternately with the insulating layers 112, and these may constitute a memory stack 111. In the through electrode area TA, the mold layers 114 might not be removed. In an example embodiment, the gate electrodes GE may include tungsten.

As shown in FIGS. 20 and 21B, the dam insulating material 160a fills the recesses R and the lengths of the gate electrodes GE to be filled may be reduced. Accordingly, the process for forming the gate electrodes GE may be simplified, and failure thereof may be reduced. Thus, an increase in reliability of the resultant device may be achieved.

Figure 24A:
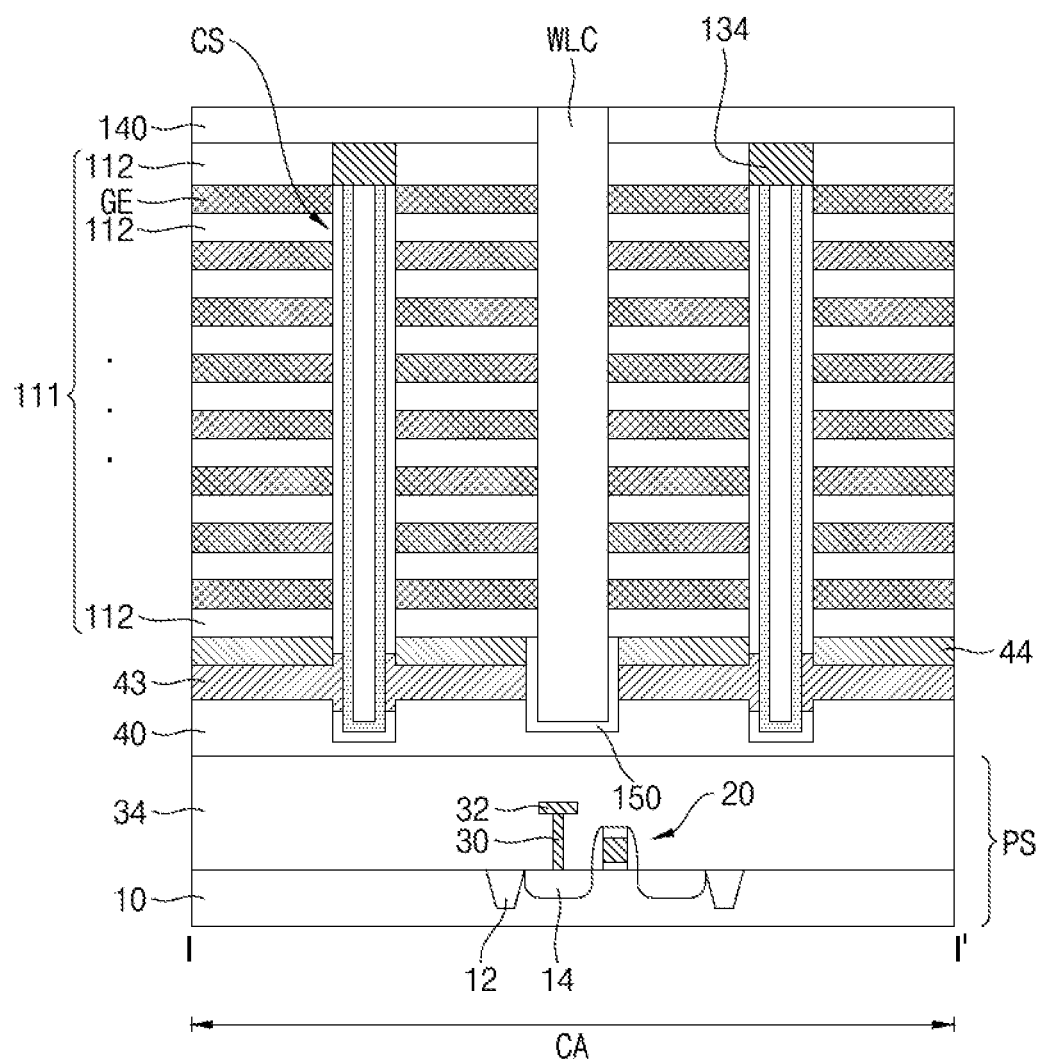
Figure 24B:
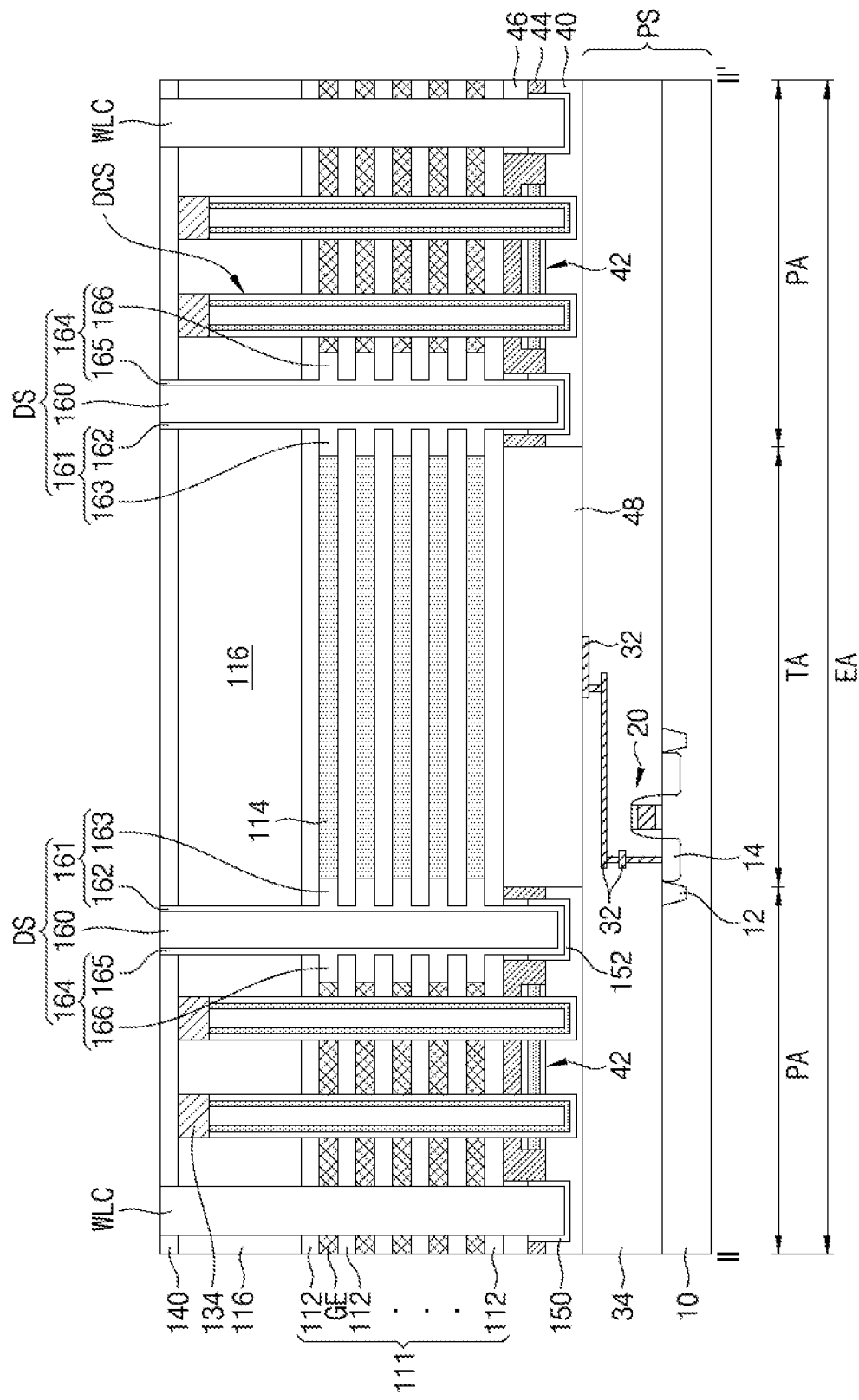

Referring to FIGS. 24A and 24B, a process for depositing an insulating material in the first isolation trench T1 and the second isolation trench T2 and a planarization process may be performed. A dam structure DS may be formed by depositing an insulating material in the first isolation trench T1. The dam structure DS may include a dam insulating layer 160 extending vertically through the memory stack 111 and the interlayer insulating layer 116 while surrounding the through electrode area TA, an inner insulating layer 161 inside the dam insulating layer 160, and an outer insulating layer 164 outside the dam insulating layer 160. In an example embodiment, the dam insulating layer 160 may include silicon oxide.

The inner insulating layer 161 may include a first side insulating layer 162 and first protrusions 163. The first side insulating layer 162 may contact an inner surface of the dam insulating layer 160 while extending in a vertical direction. Each first protrusion 163 may protrude from the first side insulating layer 162 in a horizontal direction, and may contact a corresponding mold layer 114.

The outer insulating layer 164 may include a second side insulating layer 165 and second protrusions 166. The second side insulating layer 165 may contact an outer surface of the dam insulating layer 160 while extending in a vertical direction. Each second protrusion 166 may protrude from the second side insulating layer 165 in a horizontal direction, and may contact a corresponding gate electrode GE.

As the insulating material is deposited in the second isolation trench T2, an isolation insulating layer WLC may be formed. An upper surface of the dam structure DS may be disposed at the same level as an upper surface of the isolation insulating layer WLC. For example, the upper surfaces of the dam structure DS and the isolation insulating layer WLC may be coplanar with the upper surface of the first upper insulating layer 140. The isolation insulating layer WLC may include the same material as the dam insulating layer 160, and may include, for example, silicon oxide.

Referring back to FIGS. 5 and 6, a second upper insulating layer 170, a bit line plug 172, a bit line 174, a through electrode 180 and a connecting wiring 182 may be formed.

The second upper insulating layer 170 may be formed on the first upper insulating layer 140. The bit line plug 172 may be formed by anisotropically etching the first upper insulating layer 140 and the second upper insulating layer 170, thereby forming a contact hole, and depositing a conductive material in the contact hole. The bit line 174 may be formed on the second upper insulating layer 170, and may be connected to the bit line plug 172.

The through electrode 180 may be formed in the through electrode area TA. The through electrode 180 may be made by forming a contact hole extending vertically through the buried insulating layer 48, the memory stack 111, the interlayer insulating layer 116, the first upper insulating layer 140 and the second upper insulating layer 170, and depositing a conductive material in the contact hole. The connecting wiring 182 may be formed on the second upper insulating layer 170. The connecting wiring 182 may be electrically connected to the peripheral circuit wiring 32 through the through electrode 180.

The second upper insulating layer 170 may include silicon oxide, silicon nitride, silicon oxynitride, or a combination thereof. The bit line plug 172, the bit line 174, the through electrode 180 and the connecting wiring 182 may include metal, metal nitride, metal oxide, metal silicide, polysilicon, conductive carbon, or a combination thereof.

Figure 25:
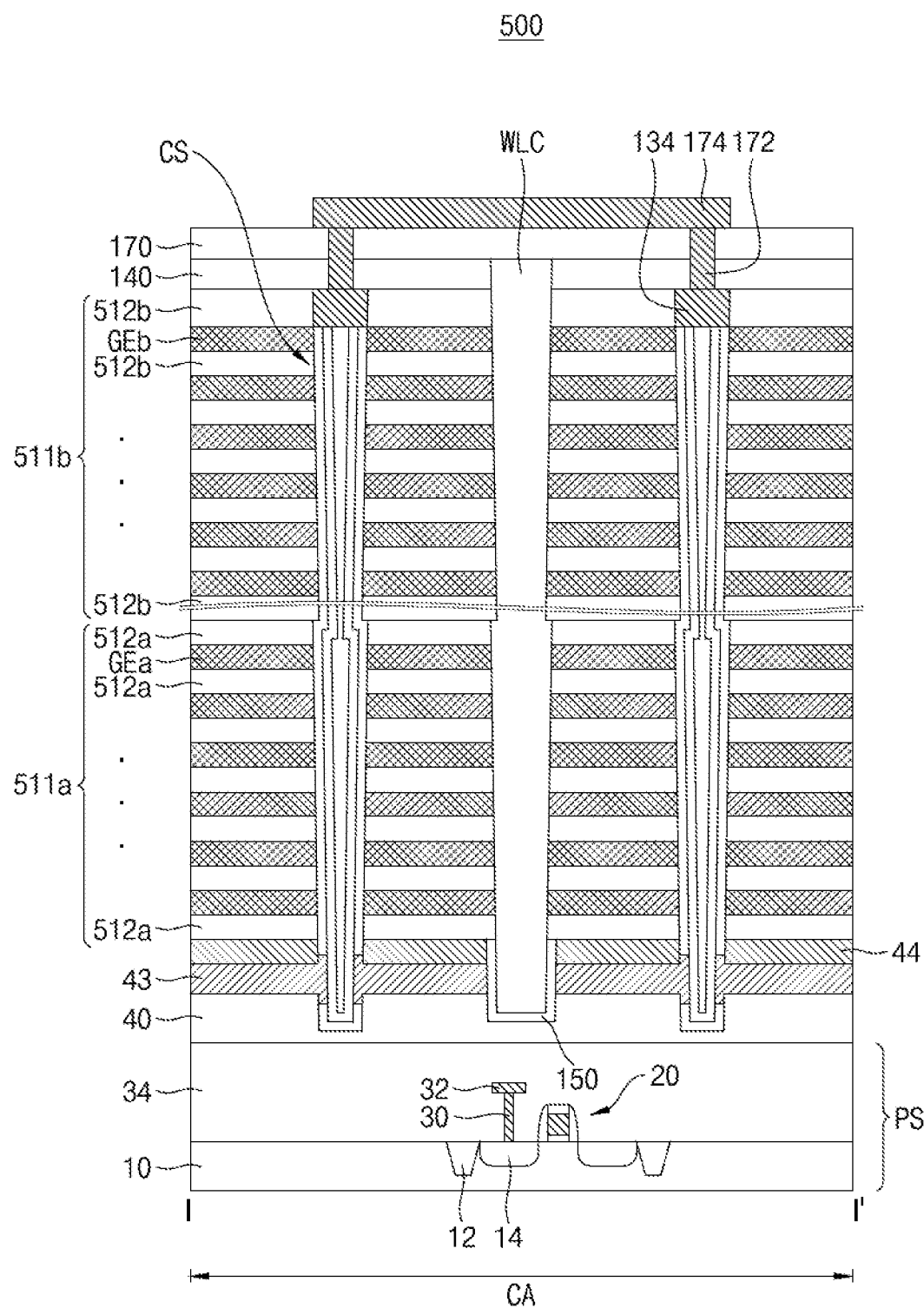
FIG. 25 is a vertical cross-sectional view taken along line I-I' of a semiconductor device according to an example embodiment of the inventive concepts.
Figure 26:
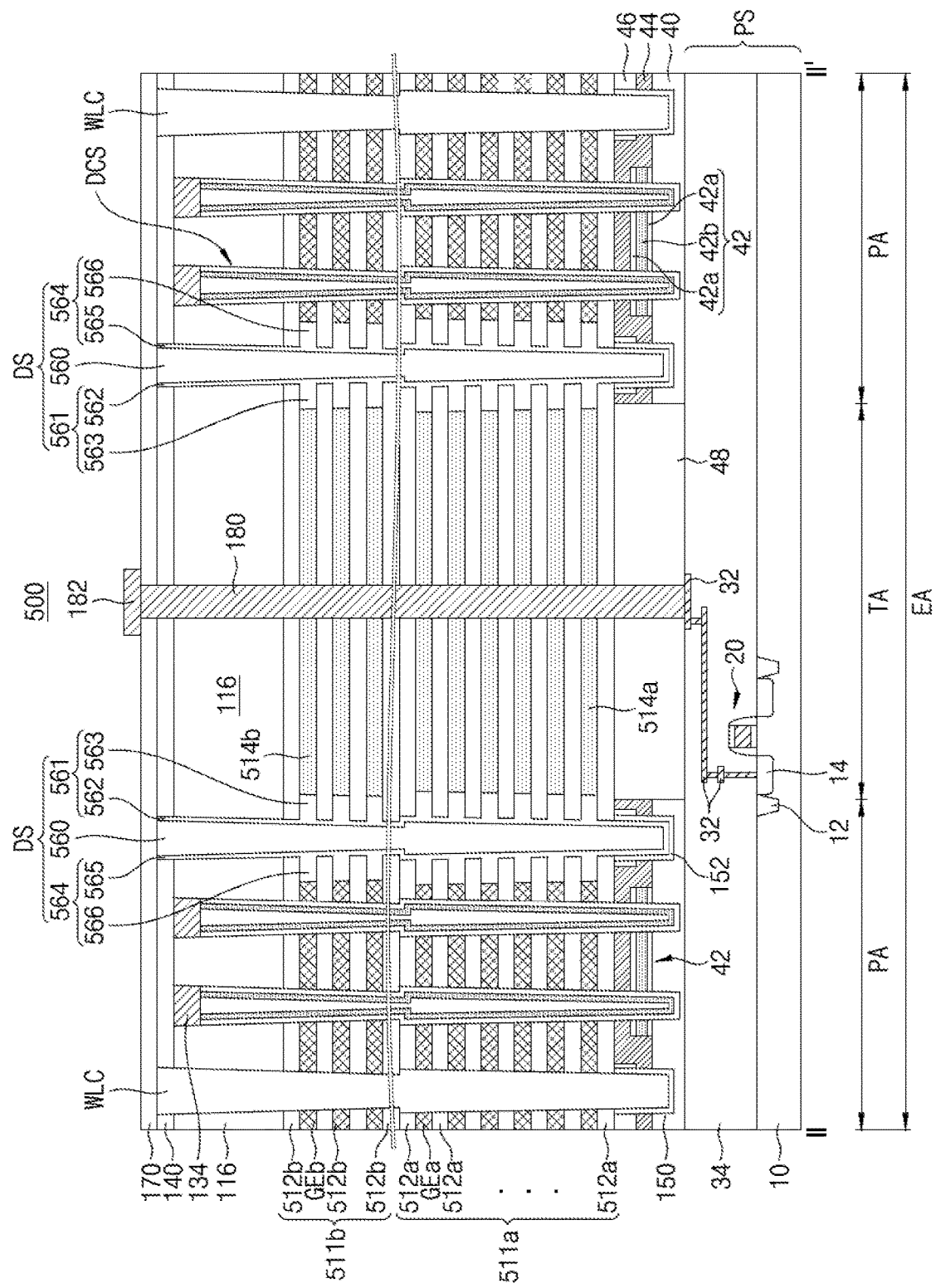
FIG. 26 is a vertical cross-sectional view taken along line II-II' of a semiconductor device according to an example embodiment of the inventive concepts.

FIG. 25 is a vertical cross-sectional view taken along line I-I' of a semiconductor device according to an example embodiment of the present inventive concepts. FIG. 26 is a vertical cross-sectional view taken along line II-II' of a semiconductor device according to an example embodiment of the present inventive concepts.

Referring to FIGS. 25 and 26, a semiconductor device 500 may have a multi-stack structure. Details may be omitted for the components that are the same or similar to those of the semiconductor device 100 of FIGS. 5 and 6. In an example embodiment, the semiconductor device 500 may include a lower stack 511a, and an upper stack 511b on the lower stack 511a.

The lower stack 511a may include lower insulating layers 512a, lower mold layers 514a, and lower gate electrodes GEa. The lower gate electrodes GEa may be stacked alternately with the lower insulating layers 512a. The lower mold layers 514a may be disposed in a through electrode area TA, and may be stacked alternately with the lower insulating layers 512a.

The upper stack 511b may include upper insulating layers 512b, upper mold layers 514b, and upper gate electrodes GEb. The upper gate electrodes GEb may be stacked alternately with the upper insulating layers 512b. The upper mold layers 514b may be disposed in the through electrode area TA, and may be stacked alternately with the upper insulating layers 512b.

In an example embodiment, a dam structure DS, an isolation insulating layer WLC and a channel structure CS may each have a tapered structure such that a horizontal width of the structure is gradually reduced as the structure extends downwards, and may have a step between the lower stack 511a and the upper stack 511b.

The dam structure DS may include a dam insulating layer 560, an inner insulating layer 561, and an outer insulating layer 564. The dam insulating layer 560 may have a dam shape, and may extend through the lower stack 511a, the upper stack 511b, an interlayer insulating layer 116 and an upper insulating layer 140.

The inner insulating layer 561 may include a first side insulating layer 562 and first protrusions 563. Each first protrusion 563 may contact a corresponding lower mold layer 514a or upper mold layer 514b in the through electrode area TA. The outer insulating layer 564 may include a second side insulating layer 565 and second protrusions 566. Each second protrusion 566 may contact a corresponding lower gate electrode GEa or the upper gate electrode GEb.

In accordance with the example embodiments of the disclosure, an increase in reliability of a device may be achieved.

While the embodiments of the disclosure have been described with reference to the accompanying drawings, it should be understood by those skilled in the art that various transitions may be made without departing from the scope of the disclosure and without changing essential features thereof. Therefore, the above-described embodiments should be considered in a descriptive sense and not for purposes of limitation.

What is claimed is:

1. A semiconductor device comprising:
    a substrate including a cell array area and an extension area, the extension area including a through electrode area;
    a memory stack on the substrate and including gate electrodes, insulating layers and mold layers, the gate electrodes and the insulating layers being sequentially stacked, the mold layers including an insulating material and being disposed at the same levels as the gate electrodes in the through electrode area;
    a channel structure extending vertically through the gate electrodes in the cell array area;
    isolation insulating layers extending vertically through the memory stack and extending in a first horizontal direction parallel to the substrate, wherein the isolation insulating layers are spaced apart from one another in a second horizontal direction parallel to the substrate and intersecting with the first horizontal direction; and
    a dam structure disposed between the isolation insulating layers and at least partially surrounding the through electrode area;
    wherein the dam structure includes a dam insulating layer having a dam shape, an inner insulating layer disposed along an inner periphery of the through electrode area, and an outer insulating layer disposed along an outer periphery of the through electrode area, and
    wherein the inner insulating layer includes first protrusions protruding in the first horizontal direction and arranged in a vertical direction perpendicular to the substrate, and the outer insulating layer includes second protrusions protruding in the first horizontal direction and arranged in the vertical direction.

2. The semiconductor device according to claim 1, wherein the inner insulating layer further includes a first side insulating layer extending vertically between the dam insulating layer and the first protrusions, and the first protrusions are materially contiguous with the first side insulating layer.

3. The semiconductor device according to claim 2, wherein the outer insulating layer further includes a second side insulating layer extending vertically between the dam insulating layer and the second protrusions, and the second protrusions are materially contiguous with the second side insulating layer.

4. The semiconductor device according to claim 3, wherein the first side insulating layer and the second side insulating layer extend along a lower surface of the dam insulating layer to contact each other.

5. The semiconductor device according to claim 3, wherein the first protrusions, the first side insulating layer, the second protrusions and the second side insulating layer are physically contiguous.

6. The semiconductor device according to claim 1, wherein horizontal widths of the first protrusions and the second protrusions are greater than 0 nm to 100 nm.

7. The semiconductor device according to claim 1, wherein the first protrusions contact the mold layers, and wherein the second protrusions contact the gate electrodes.

8. The semiconductor device according to claim 1, wherein a length of each of the mold layers is smaller than a length of the insulating layer adjacent thereto from among the insulating layers.

9. The semiconductor device according to claim 1, wherein an upper surface of the dam structure is disposed at the same level as an upper surface of the isolation insulating layer.

10. The semiconductor device according to claim 1, further comprising:
    a first lower insulating layer covering a lower portion of the isolation insulating layer; and
    a second lower insulating layer covering a lower portion of the dam structure.

11. The semiconductor device according to claim 1, wherein each of the first protrusions and the second protrusions has a convex cross-section.

12. The semiconductor device according to claim 1, wherein each of the first protrusions and the second protrusions has a concave cross-section.

13. The semiconductor device according to claim 1, wherein horizontal widths of the first protrusions are different.

14. The semiconductor device according to claim 13, wherein a lower one of the first protrusions has a greater horizontal width than an upper one of the first protrusions.

15. The semiconductor device according to claim 1, further comprising:

a peripheral circuit structure disposed between the substrate and the memory stack; and
a through electrode disposed in the through electrode area, wherein the through electrode extends vertically through the mold layers and is electrically connected to the peripheral circuit structure.

16. The semiconductor device according to claim 1, wherein the dam insulating layer includes the same material as the isolation insulating layer.

17. A semiconductor device comprising:
a substrate including a cell array area and an extension area, the extension area including a through electrode area;
a lower memory stack on the substrate and including lower gate electrodes, lower insulating layers and lower mold layers, the lower gate electrodes and the lower insulating layers being sequentially stacked, the lower mold layers including an insulating material and being disposed at the same levels as the lower gate electrodes in the through electrode area;
an upper memory stack on the lower memory stack, the upper memory stack including upper gate electrodes, upper insulating layers and upper mold layers, the upper gate electrodes and the upper insulating layers being sequentially stacked, the upper mold layers including an insulating material and being disposed at the same levels as the upper gate electrodes in the through electrode area;
a channel structure extending vertically through the upper and lower gate electrodes in the cell array area;
isolation insulating layers extending vertically through the lower memory stack and the upper memory stack and extending in a first horizontal direction parallel to the substrate, the isolation insulating layers being spaced apart from one another in a second horizontal direction parallel to the substrate and intersecting with the first horizontal direction; and
a dam structure disposed between the isolation insulating layers and surrounding the through electrode area in a top view;
wherein the dam structure includes a dam insulating layer having a dam shape, an inner insulating layer inside the dam insulating layer, and an outer insulating layer outside the dam insulating layer, and wherein the inner insulating layer includes first protrusions protruding in the first horizontal direction and arranged in a vertical direction perpendicular to the substrate, and the outer insulating layer includes second protrusions protruding in the first horizontal direction and arranged in the vertical direction.

18. The semiconductor device according to claim 17, wherein:
the inner insulating layer further includes a first side insulating layer extending vertically between the dam insulating layer and the first protrusions;
wherein the outer insulating layer further includes a second side insulating layer extending vertically between the dam insulating layer and the second protrusions; and
wherein the first protrusions, the first side insulating layer, the second protrusions and the second side insulating layer are materially contiguous.

19. The semiconductor device according to claim 17, wherein horizontal widths of the first protrusions and the second protrusions are greater than 0 nm to 100 nm.

20. A data storage system comprising:
a semiconductor storage device including a substrate including a cell array area and an extension area, the extension area including a through electrode area;
a memory stack on the substrate including gate electrodes, insulating layers and mold layers, the gate electrodes and the insulating layers being sequentially stacked, the mold layers including an insulating material and being disposed at the same levels as the gate electrodes in the through electrode area;
a channel structure extending vertically through the gate electrodes in the cell array area;
isolation insulating layers extending vertically through the memory stack and extending in a first horizontal direction parallel to the substrate, wherein the isolation insulating layers are spaced apart from one another in a second horizontal direction parallel to the substrate and intersecting with the first horizontal direction;
a peripheral circuit structure disposed between the substrate and the memory stack, the peripheral circuit structure including peripheral circuit devices;
an input/output pad electrically connected to the peripheral circuit devices;
a through electrode disposed in the through electrode area, the through electrode extending vertically through the mold layers such that the through electrode is electrically connected to the peripheral circuit structure;
a dam structure disposed between the isolation insulating layers and surrounding the through electrode area in a top view; and
a controller electrically connected to the semiconductor storage device through the input/output pad, and configured to control the semiconductor storage device,
wherein the dam structure includes a dam insulating layer having a dam shape, an inner insulating layer inside the dam insulating layer, and an outer insulating layer outside the dam insulating layer, and
wherein the inner insulating layer includes first protrusions protruding in the first horizontal direction and arranged in a vertical direction perpendicular to the substrate, and the outer insulating layer includes second protrusions protruding in the first horizontal direction and arranged in the vertical direction.

* * * * *